US012585004B1

(12) United States Patent
Hosseini et al.

(10) Patent No.: US 12,585,004 B1
(45) Date of Patent: Mar. 24, 2026

(54) LIGHT DETECTION AND RANGING (LIDAR) SENSOR SYSTEM INCLUDING INTEGRATED LIGHT SOURCE

(71) Applicant: Aurora Operations, Inc., Pittsburgh, PA (US)

(72) Inventors: Amir Hosseini, San Jose, CA (US); Sen Lin, Santa Clara, CA (US)

(73) Assignee: Aurora Operations, Inc, Pittsburgh, PA (US)

( * ) Notice: Subject to any disclaimer, the term of this patent is extended or adjusted under 35 U.S.C. 154(b) by 0 days.

(21) Appl. No.: 18/586,127

(22) Filed: Feb. 23, 2024

Related U.S. Application Data

(63) Continuation of application No. 18/060,948, filed on Dec. 1, 2022, now Pat. No. 11,940,567.

(51) Int. Cl.
*G01S 7/4912* (2020.01)
*B60W 10/18* (2012.01)
(Continued)

(52) U.S. Cl.
CPC .......... *G01S 7/4917* (2013.01); *B60W 10/18* (2013.01); *B60W 10/20* (2013.01); *B60W 60/001* (2020.02); *B60W 60/0015* (2020.02); *G01S 17/34* (2020.01); *G01S 17/58* (2013.01); *G01S 17/931* (2020.01); *G08G 1/0968* (2013.01); *H10D 18/221* (2025.01); *B60W 2420/408* (2024.01); *B60W 2554/4042* (2020.02);
(Continued)

(58) Field of Classification Search
None
See application file for complete search history.

(56) References Cited

U.S. PATENT DOCUMENTS

| | | | |
|---|---|---|---|
| 2011/0037970 A1 | 2/2011 | Rogers | |
| 2013/0121632 A1 | 5/2013 | Akutsu | |

(Continued)

FOREIGN PATENT DOCUMENTS

| | | |
|---|---|---|
| CN | 111880190 A | 11/2020 |
| CN | 113167873 A | 7/2021 |

(Continued)

OTHER PUBLICATIONS

Nanxi Li et al, "A Progress Review on Solid-State LiDAR and Nanophotonics-Based LiDAR Sensors", Laser & Photonics Reviews, vol. 16, Issue 11, Aug. 11, 2022, pp. 1-24 (Year: 2022).

(Continued)

*Primary Examiner* — Tamara L Weber
(74) *Attorney, Agent, or Firm* — Patent Law Works LLP

(57) ABSTRACT

A light detection and ranging (LIDAR) sensor system mounted to a vehicle includes a first device and a second device coupled to the first device. The first device includes a laser source and one or more optical components. The first device is configured to output an optical signal associated with a local oscillator (LO) signal. The second device includes an optical amplifier array device and a transceiver device. The optical amplifier array device includes an integrated optical component and is configured to amplify the optical signal. The transceiver device is configured to transmit the amplified optical signal to an environment and receive a returned optical signal that is reflected from an object in the environment.

20 Claims, 12 Drawing Sheets

(51) Int. Cl.

| | |
|---|---|
| *B60W 10/20* | (2006.01) |
| *B60W 60/00* | (2020.01) |
| *G01S 17/34* | (2020.01) |
| *G01S 17/58* | (2006.01) |
| *G01S 17/931* | (2020.01) |
| *G08G 1/0968* | (2006.01) |
| *H10D 18/00* | (2025.01) |

(52) U.S. Cl.

CPC ... *B60W 2554/802* (2020.02); *B60W 2710/18* (2013.01); *B60W 2710/20* (2013.01)

(56) References Cited

U.S. PATENT DOCUMENTS

| | | | |
|---|---|---|---|
| 2018/0306925 | A1 | 10/2018 | Hosseini |
| 2019/0391243 | A1 | 12/2019 | Nicolaescu |
| 2020/0284879 | A1 | 9/2020 | Asghari |
| 2020/0333533 | A1 | 10/2020 | Rogers |
| 2021/0141058 | A1* | 5/2021 | Piggott ................. G01S 7/4817 |
| 2021/0257396 | A1 | 8/2021 | Piggott |
| 2021/0382142 | A1* | 12/2021 | Rogers .................. G01S 7/4861 |
| 2021/0384709 | A1 | 12/2021 | Takabayashi |
| 2022/0003845 | A1* | 1/2022 | Wang .................. H01S 5/02208 |
| 2022/0011409 | A1 | 1/2022 | Hosseini |
| 2022/0043127 | A1* | 2/2022 | LaChapelle ............. G01S 7/484 |
| 2022/0221566 | A1 | 7/2022 | Hong |
| 2023/0023043 | A1 | 1/2023 | Salsbury |
| 2023/0275402 | A1* | 8/2023 | Sun ........................ H01S 5/1014 |
| | | | 356/4.01 |
| 2024/0061087 | A1* | 2/2024 | Walker .................. G01S 7/4863 |

FOREIGN PATENT DOCUMENTS

| | | | |
|---|---|---|---|
| CN | 115004059 | A | 9/2022 |
| JP | 200733415 | | 2/2007 |
| JP | 2020530566 | A | 10/2020 |
| JP | 2022524352 | A | 5/2022 |
| KR | 20170071606 | A | 6/2017 |
| KR | 20180020035 | A | 2/2018 |
| KR | 2020510882 | | 4/2020 |
| KR | 20210137201 | A | 11/2021 |
| WO | 2021146116 | A1 | 7/2021 |

OTHER PUBLICATIONS

International Search Report and Written Opinion, issued for PCT/US2023/080145, mailed Apr. 2, 2024, 13 pgs.

Request For The Submission of an Opinion, Issued from the Korean Patent Office for application No. 10-2025-7015154, mailed Oct. 9, 2025, machine translation, 8 pgs.

Notice of First Examination Opinion, issued for CN application No. 202380079034, dated Sep. 25, 2025, 17 pgs.

\* cited by examiner

Figure 1A:
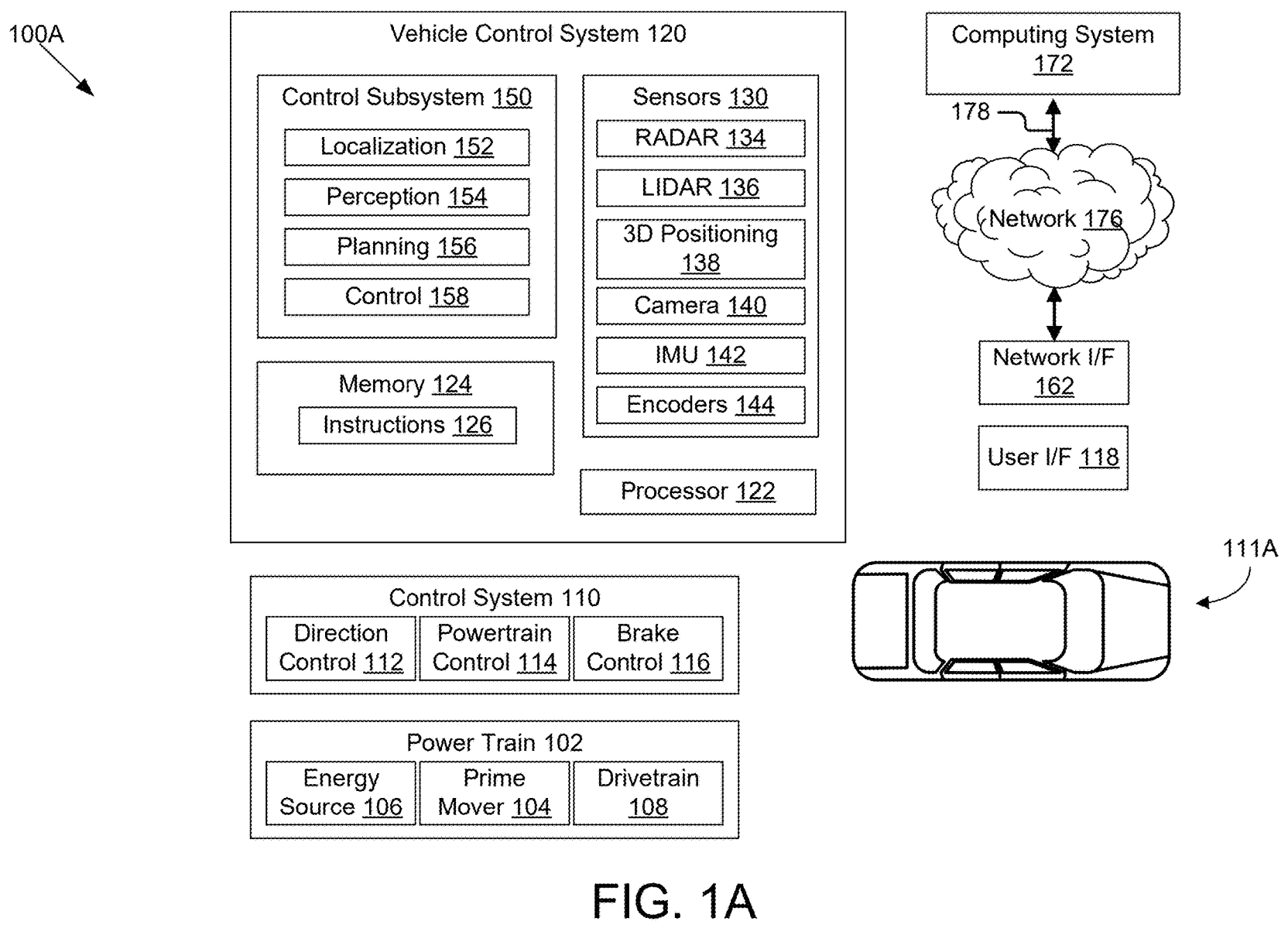

Computing System 172

178

Network 176

Network I/F 162

User I/F 118

111A

Vehicle Control System 120

Sensors 130

RADAR 134

LIDAR 136

3D Positioning 138

Camera 140

IMU 142

Encoders 144

Processor 122

Control Subsystem 150

Localization 152

Perception 154

Planning 156

Control 158

Memory 124

Instructions 126

Control System 110

Powertrain Control 114

Brake Control 116

Direction Control 112

Power Train 102

Prime Mover 104

Drivetrain 108

Energy Source 106

Short Distance
(e.g., 30 meters)

111C

Long Distance
(e.g., 100 meters)

184B

180B

182B

100C

111D

Long Distance (e.g., 300 meters)

180B

184B

182B

100D

LIGHT DETECTION AND RANGING (LIDAR) SENSOR SYSTEM INCLUDING INTEGRATED LIGHT SOURCE

CROSS REFERENCE TO RELATED APPLICATIONS

This application is a continuation of U.S. patent application Ser. No. 18/060,948, filed Dec. 1, 2022, and entitled "Light Detection and Ranging (LIDAR) Sensor System Including Integrated Light Source," which is incorporated herein by reference in its entirety.

TECHNICAL FIELD

The present disclosure pertains generally to a light detection and ranging (LIDAR) sensor system, and more specifically to a LIDAR sensor system including an integrated light source.

BACKGROUND

LIDAR sensor systems are used for a variety of applications, from altimetry, to imaging, to collision avoidance. LIDAR provides finer scale range resolution with smaller beam sizes than conventional microwave ranging systems, such as radio-wave detection and ranging (RADAR). Optical detection of range can be accomplished with several different techniques, including direct ranging based on round trip travel time of an optical pulse to an object, and chirped detection based on a frequency difference between a transmitted chirped optical signal and a returned signal scattered from an object, and phase-encoded detection based on a sequence of single frequency phase changes that are distinguishable from natural signals.

SUMMARY

Implementations of the present disclosure relate to a light detection and ranging (LIDAR) sensor system, and more particularly to a system and a method for a LIDAR sensor system including an integrated light source.

In some implementations of the present disclosure, a light detection and ranging (LIDAR) system for a vehicle may include a first device and a second device coupled to the first device. The first device may include a laser source and one or more components and be configured to output an optical signal associated with a local oscillator (LO) signal. The second device may include an optical amplifier array device and a transceiver device. The optical amplifier array device may include an integrated optical component and configured to amplify the optical signal. An input of the optical amplifier array device may be coupled to the first output of the first device for receiving the optical signal. The transceiver device may be configured to transmit the amplified optical signal to an environment and receive a returned optical signal that is reflected from an object in the environment. A first input of the transceiver device may be coupled to the output of the optical amplifier array device for receiving the amplified optical signal and a second input of the transceiver device may be coupled to a second output of the first device for receiving the LO signal. In some implementations of the present disclosure, an autonomous vehicle control system may include a LIDAR system as described herein and one or more processors configured to determine at least one of a range to the object or a velocity of the object using the returned optical signal and control operation of an autonomous vehicle responsive to the at least one of the range or the velocity. In some implementations of the present disclosure, an autonomous vehicle may include a LIDAR system as described herein, a steering system, a braking system, and a vehicle controller. The vehicle controller may include one or more processors configured to determine at least one of a range to the object or a velocity of the object using the returned optical signal and control operation of at least one of the steering system and the braking system responsive to the at least one of the range or the velocity.

These and other implementations may each optionally include one or more of the following aspects. For instance, the aspects may include the integrated optical component including a U-shaped passive waveguide for receiving the optical signal from the first output of the first device and guiding the optical signal into the input of the optical amplifier array device for amplification. For instance, the aspects may also include the input and the output of the optical amplifier array device being on a particular side of the optical amplifier array device. For instance, the aspects may further include a waveguide end of the output of the optical amplifier array device being aligned and coupled to a waveguide end of the first input of the transceiver device. For instance, the aspects may additionally include the optical amplifier array device including at least one of a plurality of cascaded optical amplifier array devices in the second device, the transceiver device including at least one of a plurality of cascaded transceiver devices in the second device. For instance, the aspects may include the optical amplifier array device including a plurality of semiconductor optical amplifiers, each of the plurality of semiconductor optical amplifiers receiving the optical signal through a corresponding input and outputting the amplified optical signal through a corresponding output. For instance, the aspects may also include the second device including a splitter assembly and the first device being configured to provide the optical signal to the optical amplifier array device through the splitter assembly. For instance, the aspects may further include an output of the splitter assembly being coupled to the input of the optical amplifier array device and an input of the splitter assembly being coupled to the first output of the first device. For instance, the aspects may include the transceiver device further configured to determine an amplitude and a phase of the returned optical signal. For instance, the aspects may further include an output optical power of each of the plurality of semiconductor optical amplifiers being at least 200 milliwatts. For instance, the aspects may additionally include the first device including III-V semiconductor circuitry and the second device including at least one of silicon photonics circuitry, programmable logic controller (PLC), or III-V semiconductor circuitry.

Those skilled in the art will appreciate that the summary is illustrative only and is not intended to be in any way limiting. Any of the features described herein may be used with any other features, and any subset of such features can be used in combination according to various embodiments. Other aspects, inventive features, and advantages of the devices and/or processes described herein, as defined solely by the claims, will become apparent in the detailed description set forth herein and taken in conjunction with the accompanying drawings. Moreover, the language used in the present disclosure has been principally selected for readability and instructional purposes, and not to limit the scope of the subject matter disclosed herein.

BRIEF DESCRIPTION OF THE DRAWINGS

Implementations are illustrated by way of example, and not by way of limitation, in the figures of the accompanying drawings in which like reference numerals refer to similar elements and in which:

FIG. 1A is a block diagram illustrating an example of a system environment for an autonomous vehicle according to some implementations.

Figure 1B:
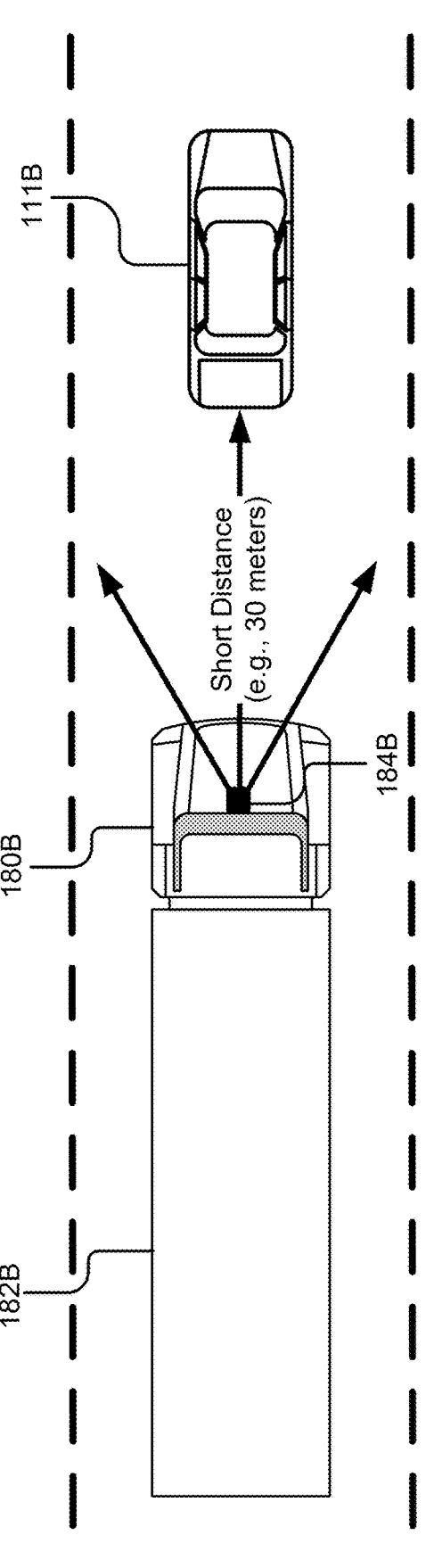
FIG. 1B is a block diagram illustrating an example of a system environment for autonomous commercial trucking vehicles, according to some implementations.

It should be understood that alternative implementations of the structures and methods illustrated herein may be employed without departing from the principles described herein.

DETAILED DESCRIPTION

According to certain aspects, a light detection and ranging (LIDAR) system for a vehicle may include a first device and a second device coupled to the first device. The first device may include a laser source and one or more components and be configured to output an optical signal associated with a local oscillator (LO) signal. The second device may include an optical amplifier array device and a transceiver device. The optical amplifier array device may include an integrated optical component and configured to amplify the optical signal. An input of the optical amplifier array device may be coupled to the first output of the first device for receiving the optical signal. The transceiver device may be configured to transmit the amplified optical signal to an environment and receive a returned optical signal that is reflected from an object in the environment. A first input of the transceiver device may be coupled to the output of the optical amplifier array device for receiving the amplified optical signal and a second input of the transceiver device may be coupled to a second output of the first device for receiving the LO signal.

In the following description, for purposes of explanation, numerous specific details are set forth to provide a thorough understanding of the various aspects of different example implementations. Note that any particular example implementation may in various cases be practiced without all of the specific details and/or with variations, permutations, and combinations of the various features and elements described herein. Reference will now be made in detail to the implementations of the present disclosure, examples of which are illustrated in the accompanying drawings. Wherever possible, the same reference numbers are used in the drawings and the description to refer to the same or like parts.

System Environment for Autonomous Vehicles

Referring to the drawings, wherein like numbers denote like parts throughout the several views, FIG. 1A illustrates an example of a system environment 100A for an autonomous vehicle 111A within which various techniques disclosed herein may be implemented. The vehicle 111A, for example, may include a powertrain 102 including a prime mover 104 powered by an energy source 106 and capable of providing power to a drivetrain 108, as well as a control system 110 including a direction control 112, a powertrain control 114, and a brake control 116. The vehicle 111A may be implemented as any number of different types of vehicles, including vehicles capable of transporting people and/or cargo, and capable of traveling by land and it should be appreciated that the aforementioned components 102-116 may vary widely based upon the type of vehicle within which these components are utilized.

For simplicity, the implementations discussed hereinafter focus on a wheeled land vehicle such as a car, van, truck, bus, etc. In such implementations, the prime mover 104 may include one or more electric motors and/or an internal combustion engine (among others). The energy source 106 may include, for example, a fuel system (e.g., providing gasoline, diesel, hydrogen, etc.), a battery system, solar panels or other renewable energy source, and/or a fuel cell system. The drivetrain 108 includes wheels and/or tires along with a transmission and/or any other mechanical drive components suitable for converting the output of the prime mover 104 into vehicular motion, as well as one or more brakes configured to controllably stop or slow the vehicle 111A and direction or steering components suitable for controlling the trajectory of the vehicle 111A (e.g., a rack and pinion steering linkage enabling one or more wheels of the vehicle 111A to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles), and in other implementations, multiple electric motors (e.g., dedicated to individual wheels or axles) may be used as a prime mover 104. In the case of a hydrogen fuel cell implementation, the prime mover 104 may include one or more electric motors and the energy source 106 may include a fuel cell system powered by hydrogen fuel.

The direction control 112 may include one or more actuators and/or sensors for controlling and receiving feedback from the direction or steering components to enable the vehicle 111A to follow a desired trajectory. The powertrain control 114 may be configured to control the output of the powertrain 102, e.g., to control the output power of the prime mover 104, to control a gear of a transmission in the drivetrain 108, etc., thereby controlling a speed and/or direction of the vehicle 111A. The brake control 116 may be configured to control one or more brakes that slow or stop vehicle 111A, e.g., disk or drum brakes coupled to the wheels of the vehicle.

Other vehicle types, including, but not limited to, all-terrain or tracked vehicles, and construction equipment, may utilize different powertrains, drivetrains, energy sources, direction controls, powertrain controls and brake controls. Moreover, in some implementations, some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

In the illustrated implementation, various levels of autonomous control including full or semi-autonomous control over the vehicle 111A can be implemented in a vehicle control system 120, which may include one or more processors 122 and one or more memories 124, with each processor 122 configured to execute program code instructions 126 stored in a memory 124. The processor(s) can include, for example, graphics processing unit(s) ("GPU(s)") and/or central processing unit(s) ("CPU(s)").

Sensors 130 may include various sensors suitable for collecting information from a vehicle's surrounding environment for use in controlling the operation of the vehicle 111A. For example, sensors 130 can include one or more detection and ranging sensors (e.g., a RADAR sensor 134, a LIDAR sensor 136, or both), a 3D positioning sensor 138, e.g., a satellite navigation system such as GPS (Global Positioning System), GLONASS (Globalnaya Navigazionnaya Sputnikovaya Sistema, or Global Navigation Satellite System), BeiDou Navigation Satellite System (BDS), Galileo, Compass, etc. The 3D positioning sensors 138 can be used to determine the location of the vehicle on the Earth using satellite signals. The sensors 130 can optionally include a camera 140 and/or an IMU (inertial measurement unit) 142. The camera 140 can be a monographic or stereographic camera and can record still and/or video images. The IMU 142 can include multiple gyroscopes and accelerometers capable of detecting linear and rotational motion of the vehicle 111A in three directions. One or more encoders 144, such as wheel encoders may be used to monitor the rotation of one or more wheels of vehicle 111A. In some implementations, the LIDAR sensor 136 may include a structure of the silicon photonics device for the coherent LIDAR system as described in detail below.

The outputs of sensors 130 may be provided to a set of control subsystems 150, including, a localization subsystem 152, a perception subsystem 154, a planning subsystem 156, and a control subsystem 158. The localization subsystem 152 is principally responsible for precisely determining the location and orientation (also sometimes referred to as "pose" or "pose estimation") of the vehicle 111A within its surrounding environment, and generally within some frame of reference. The perception subsystem 154 is principally responsible for detecting, tracking, and/or identifying objects within the environment surrounding the vehicle 111A. A machine learning model in accordance with some implementations can be utilized in tracking objects. The planning subsystem 156 is principally responsible for planning a trajectory or a path of motion for vehicle 111A over some timeframe given a desired destination as well as the static and moving objects within the environment. A machine learning model in accordance with some implementations can be utilized in planning a vehicle trajectory. The control subsystem 158 is principally responsible for generating suitable control signals for controlling the various controls in the vehicle control system 120 in order to implement the planned trajectory of the vehicle 111A. Similarly, a machine learning model can be utilized to generate one or more signals to control the autonomous vehicle 111A to implement the planned trajectory.

It will be appreciated that the collection of components illustrated in FIG. 1A for the vehicle control system 120 is merely one example. Individual sensors may be omitted in some implementations. Additionally, or alternatively, in some implementations, multiple sensors of the same types illustrated in FIG. 1A may be used for redundancy and/or to cover different regions around a vehicle. Moreover, there may be additional sensors of other types beyond those described above to provide actual sensor data related to the operation and environment of the wheeled land vehicle. Likewise, different types and/or combinations of control subsystems may be used in other implementations. Further, while subsystems 152-158 are illustrated as being separate from processor 122 and memory 124, it should be appreciated that in some implementations, some or all of the functionality of a subsystem 152-158 may be implemented with program code instructions 126 resident in one or more memories 124 and executed by one or more processors 122, and that these subsystems 152-158 may in some instances be implemented using the same processor(s) and/or memory. Subsystems may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in the vehicle control system 120 may be networked in various manners.

In some implementations, the vehicle 111A may also include a secondary vehicle control system (not illustrated), which may be used as a redundant or backup control system for the vehicle 111A. In some implementations, the secondary vehicle control system may be capable of fully operating the autonomous vehicle 111A in the event of an adverse event in the vehicle control system 120, while in other implementations, the secondary vehicle control system may only have limited functionality, e.g., to perform a controlled stop of the vehicle 111A in response to an adverse event detected in the primary vehicle control system 120. In still other implementations, the secondary vehicle control system may be omitted.

In general, different architectures, including various combinations of software, hardware, circuit logic, sensors, networks, etc. may be used to implement the various components illustrated in FIG. 1A. Each processor may be implemented, for example, as a microprocessor and each memory may represent the random-access memory ("RAM") devices comprising a main storage, as well as any supplemental levels of memory, e.g., cache memories, non-volatile or backup memories (e.g., programmable or flash memories), read-only memories, etc. In addition, each memory may be considered to include memory storage physically located elsewhere in the vehicle 111A, e.g., any cache memory in a processor, as well as any storage capacity used as a virtual memory, e.g., as stored on a mass storage device or another computer controller. One or more processors 122 illustrated in FIG. 1A, or entirely separate processors, may be used to implement additional functionality in the vehicle 111A outside of the purposes of autonomous control, e.g., to control entertainment systems, to operate doors, lights, convenience features, etc.

In addition, for additional storage, the vehicle 111A may include one or more mass storage devices, e.g., a removable disk drive, a hard disk drive, a direct access storage device ("DASD"), an optical drive (e.g., a CD drive, a DVD drive, etc.), a solid-state storage drive ("SSD"), network attached storage, a storage area network, and/or a tape drive, among others.

Furthermore, the vehicle 100 may include a user interface 118 to enable vehicle 111A to receive a number of inputs from and generate outputs for a user or operator, e.g., one or more displays, touchscreens, voice and/or gesture interfaces, buttons and other tactile controls, etc. Otherwise, user input may be received via another computer or electronic device, e.g., via an app on a mobile device or via a web interface.

Moreover, the vehicle 111A may include one or more network interfaces, e.g., network interface 162, suitable for communicating with one or more networks 176 to permit the communication of information with other computers and electronic devices, including, for example, a central service, such as a cloud service, from which the vehicle 111A receives information including trained machine learning models and other data for use in autonomous control thereof. The one or more networks 176, for example, may be a communication network and include a wide area network ("WAN") such as the Internet, one or more local area networks ("LANs") such as Wi-Fi LANs, mesh networks, etc., and one or more bus subsystems. The one or more networks 176 may optionally utilize one or more standard communication technologies, protocols, and/or inter-process communication techniques. In some implementations, data collected by the one or more sensors 130 can be uploaded to a computing system 172 via the network 176 for additional processing. In the illustrated implementation, the vehicle 111A may communicate via the network 176 and signal line 178 with a computing system 172. In some implementations, the computing system 172 is a cloud-based computing device. Additionally processing of autonomous vehicle data by computing system 172 in accordance with many implementations is described with respect to FIG. 2.

Each processor illustrated in FIG. 1A, as well as various additional controllers and subsystems disclosed herein, generally operates under the control of an operating system and executes or otherwise relies upon various computer software applications, components, programs, objects, modules, data structures, etc., as described in greater detail below. Moreover, various applications, components, programs, objects, modules, etc. may also execute on one or more processors in another computer (e.g., computing system 172) coupled to vehicle 100 via network 176, e.g., in a distributed, cloud-based, or client-server computing environment, whereby the processing required to implement the functions of a computer program may be allocated to multiple computers and/or services over a network.

In general, the routines executed to implement the various implementations described herein, whether implemented as part of an operating system or a specific application, component, program, object, module or sequence of instructions, or even a subset thereof, are referred to herein as "program code." Program code typically comprises one or more instructions that are resident at various times in various memory and storage devices, and that, when read and executed by one or more processors, perform the steps necessary to execute steps or elements embodying the various aspects of the present disclosure. Moreover, while implementations have and hereinafter are described in the context of fully functioning computers and systems, it should be appreciated that the various implementations described herein are capable of being distributed as a program product in a variety of forms, and that implementations can be implemented regardless of the particular type of computer readable media used to actually carry out the distribution.

Examples of computer readable media include tangible, non-transitory media such as volatile and non-volatile memory devices, floppy and other removable disks, solid state drives, hard disk drives, magnetic tape, and optical disks (e.g., CD-ROMs, DVDs, etc.) among others.

In addition, various program code described hereinafter may be identified based upon the application within which it is implemented in a specific implementation. However, it should be appreciated that any particular program nomenclature that follows is used merely for convenience, and thus the present disclosure should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the present disclosure is not limited to the specific organization and allocation of program functionality described herein.

The example environment illustrated in FIG. 1A is not intended to limit implementations disclosed herein. Indeed, other alternative hardware and/or software environments may be used without departing from the scope of implementations disclosed herein.

FM LIDAR for Automotive Applications

Figure 2:
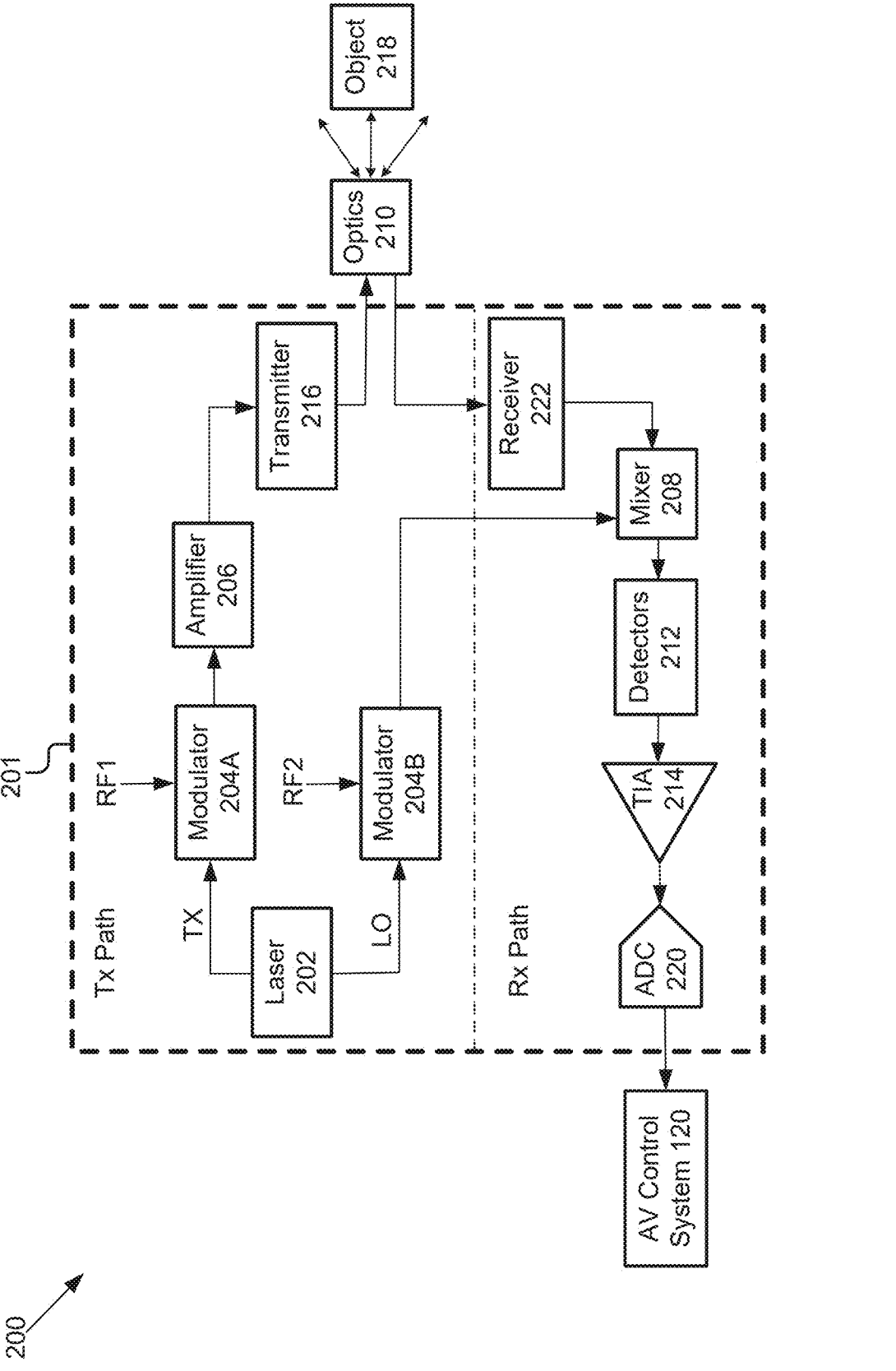
FIG. 2 is a block diagram illustrating an example of a LIDAR sensor system for autonomous vehicles, according to some implementations.

A truck can include a LIDAR system (e.g., vehicle control system 120 in FIG. 1A, LIDAR sensor system 201 in FIG. 2, etc.). In some implementations, the LIDAR system can use frequency modulation to encode an optical signal and scatter the encoded optical signal into free-space using optics. By detecting the frequency differences between the encoded optical signal and a returned signal reflected back from an object, the frequency modulated (FM) LIDAR system can determine the location of the object and/or precisely measure the velocity of the object using the Doppler effect. An FM LIDAR system may use a continuous wave (referred to as, "FMCW LIDAR" or "coherent FMCW LIDAR") or a quasi-continuous wave (referred to as, "FMQW LIDAR"). The LIDAR system can use phase modulation (PM) to encode an optical signal and scatters the encoded optical signal into free-space using optics.

An FM or phase-modulated (PM) LIDAR system may provide substantial advantages over conventional LIDAR systems with respect to automotive and/or commercial trucking applications. To begin, in some instances, an object (e.g., a pedestrian wearing dark clothing) may have a low reflectivity, in that it only reflects back to the sensors (e.g., sensors 130 in FIG. 1A) of the FM or PM LIDAR system a low amount (e.g., 10% or less) of the light that hits the object. In other instances, an object (e.g., a shiny road sign) may have a high reflectivity (e.g., above 10%), in that it reflects back to the sensors of the FM LIDAR system a high amount of the light that hit the object.

Regardless of the object's reflectivity, an FM LIDAR system may be able to detect (e.g., classify, recognize, discover, etc.) the object at greater distances (e.g., 2×) than a conventional LIDAR system. For example, an FM LIDAR system may detect a low reflectivity object beyond 300 meters, and a high reflectivity object beyond 400 meters.

To achieve such improvements in detection capability, the FM LIDAR system may use sensors (e.g., sensors 130 in FIG. 1A). In some implementations, these sensors can be single photon sensitive, meaning that they can detect the smallest amount of light possible. While an FM LIDAR system may, in some applications, use infrared wavelengths (e.g., 950 nm, 1550 nm, etc.), it is not limited to the infrared wavelength range (e.g., near infrared: 800 nm-1500 nm; middle infrared: 1500 nm-5600 nm; and far infrared: 5600 nm-1,000,000 nm). By operating the FM or PM LIDAR system in infrared wavelengths, the FM or PM LIDAR system can broadcast stronger light pulses or light beams while meeting eye safety standards. Conventional LIDAR systems are often not single photon sensitive and/or only operate in near infrared wavelengths, requiring them to limit their light output (and distance detection capability) for eye safety reasons.

Thus, by detecting an object at greater distances, an FM LIDAR system may have more time to react to unexpected obstacles. Indeed, even a few milliseconds of extra time could improve safety and comfort, especially with heavy vehicles (e.g., commercial trucking vehicles) that are driving at highway speeds.

Another advantage of an FM LIDAR system is that it provides accurate velocity for each data point instantaneously. In some implementations, a velocity measurement is accomplished using the Doppler effect which shifts frequency of the light received from the object based at least one of the velocity in the radial direction (e.g., the direction vector between the object detected and the sensor) or the frequency of the laser signal. For example, for velocities encountered in on-road situations where the velocity is less than 100 meters per second (m/s), this shift at a wavelength of 1550 nanometers (nm) amounts to the frequency shift that is less than 130 megahertz (MHz). This frequency shift is small such that it is difficult to detect directly in the optical domain. However, by using coherent detection in FMCW or PMCW LIDAR systems, the signal can be converted to the RF domain such that the frequency shift can be calculated using various signal processing techniques. This enables the autonomous vehicle control system to process incoming data faster.

Instantaneous velocity calculation also makes it easier for the FM LIDAR system to determine distant or sparse data points as objects and/or track how those objects are moving over time. For example, an FM LIDAR sensor (e.g., sensors 130 in FIG. 1A) may only receive a few returns (e.g., hits) on an object that is 300 m away, but if those returns give a velocity value of interest (e.g., moving towards the vehicle at >70 mph), then the FM LIDAR system and/or the autonomous vehicle control system may determine respective weights to probabilities associated with the objects.

Faster identification and/or tracking of the FM LIDAR system gives an autonomous vehicle control system more time to maneuver a vehicle. A better understanding of how fast objects are moving also allows the autonomous vehicle control system to plan a better reaction.

Another advantage of an FM LIDAR system is that it is less static compared to conventional LIDAR systems. That is, the conventional LIDAR systems that are designed to be more light-sensitive typically perform poorly in bright sunlight. These systems also tend to suffer from crosstalk (e.g., when sensors get confused by each other's light pulses or light beams) and from self-interference (e.g., when a sensor gets confused by its own previous light pulse or light beam). To overcome these disadvantages, vehicles using the conventional LIDAR systems often need extra hardware, complex software, and/or more computational power to manage this "noise."

In contrast, FM LIDAR systems do not suffer from these types of issues because each sensor is specially designed to respond only to its own light characteristics (e.g., light beams, light waves, light pulses). If the returning light does not match the timing, frequency, and/or wavelength of what was originally transmitted, then the FM sensor can filter (e.g., remove, ignore, etc.) out that data point. As such, FM LIDAR systems produce (e.g., generates, derives, etc.) more accurate data with less hardware or software requirements, enabling safer and smoother driving.

Lastly, an FM LIDAR system is easier to scale than conventional LIDAR systems. As more self-driving vehicles (e.g., cars, commercial trucks, etc.) show up on the road, those powered by an FM LIDAR system likely will not have to contend with interference issues from sensor crosstalk. Furthermore, an FM LIDAR system uses less optical peak power than conventional LIDAR sensors. As such, some or all of the optical components for an FM LIDAR can be produced on a single chip, which produces its own benefits, as discussed herein.

Commercial Trucking

FIG. 1B is a block diagram illustrating an example of a system environment for autonomous commercial trucking vehicles, according to some implementations. The environment 100B includes a commercial truck 180B for hauling cargo 182B. In some implementations, the commercial truck 180B may include vehicles configured to long-haul freight transport, regional freight transport, intermodal freight transport (i.e., in which a road-based vehicle is used as one of multiple modes of transportation to move freight), and/or any other road-based freight transport applications. The commercial truck 180B may be a flatbed truck, a refrigerated truck (e.g., a reefer truck), a vented van (e.g., dry van), a moving truck, etc. The cargo 182B may be goods and/or produce. The commercial truck 180B may include a trailer to carry the cargo 182B, such as a flatbed trailer, a lowboy trailer, a step deck trailer, an extendable flatbed trailer, a side kit trailer, etc.

The environment 100B includes an object 111B (shown in FIG. 1B as another vehicle) that is within a distance range that is equal to or less than 30 meters from the truck.

The commercial truck 180B may include a LIDAR system 184B (e.g., an FM LIDAR system, vehicle control system 120 in FIG. 1A, LIDAR system 201 in FIG. 2, etc.) for determining a distance to the object 111B and/or measuring the velocity of the object 111B. Although FIG. 1B shows that one LIDAR system 184B is mounted on the front of the commercial truck 180B, the number of LIDAR systems and the mounting area of the LIDAR systems on the commercial truck are not limited to a particular number or a particular area. The commercial truck 180B may include any number of LIDAR systems 184B (or components thereof, such as sensors, modulators, coherent signal generators, etc.) that are mounted onto any area (e.g., front, back, side, top, bottom, underneath, and/or bottom) of the commercial truck 180B to facilitate the detection of an object in any free-space relative to the commercial truck 180B.

As shown, the LIDAR system 184B in environment 100B may be configured to detect an object (e.g., another vehicle, a bicycle, a tree, street signs, potholes, etc.) at short distances (e.g., 30 meters or less) from the commercial truck 180B.

Figure 1C:
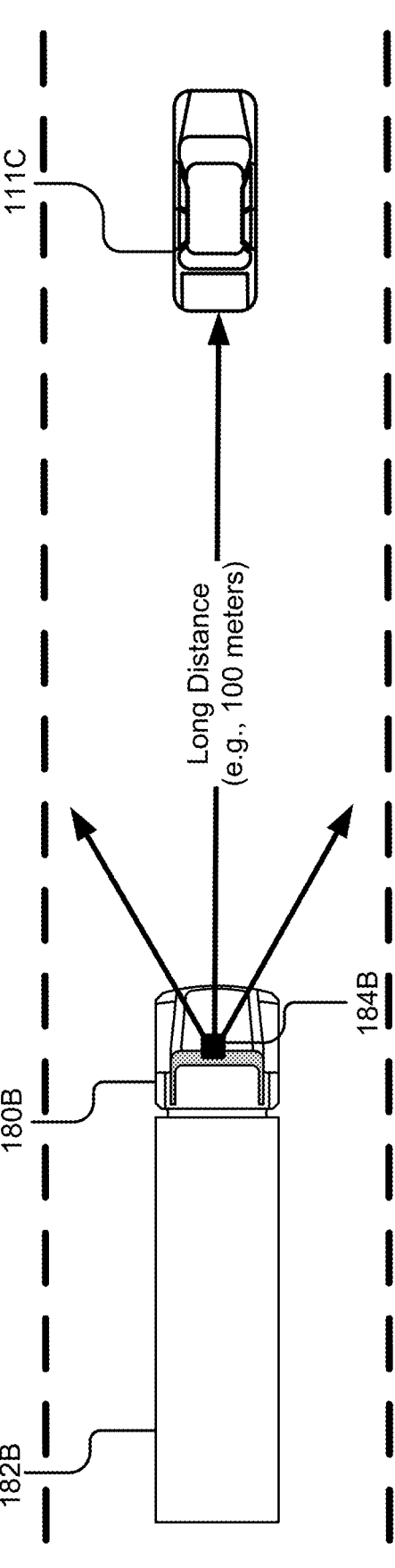
FIG. 1C is a block diagram illustrating an example of a system environment for autonomous commercial trucking vehicles, according to some implementations.

FIG. 1C is a block diagram illustrating an example of a system environment for autonomous commercial trucking vehicles, according to some implementations. The environment 100C includes the same components (e.g., commercial truck 180B, cargo 182B, LIDAR system 184B, etc.) that are included in environment 100B.

The environment 100C includes an object 111C (shown in FIG. 1C as another vehicle) that is within a distance range that is (i) more than 30 meters and (ii) equal to or less than 150 meters from the commercial truck 180B. As shown, the LIDAR system 184B in environment 100C may be configured to detect an object (e.g., another vehicle, a bicycle, a tree, street signs, potholes, etc.) at a distance (e.g., 100 meters) from the commercial truck 180B.

Figure 1D:
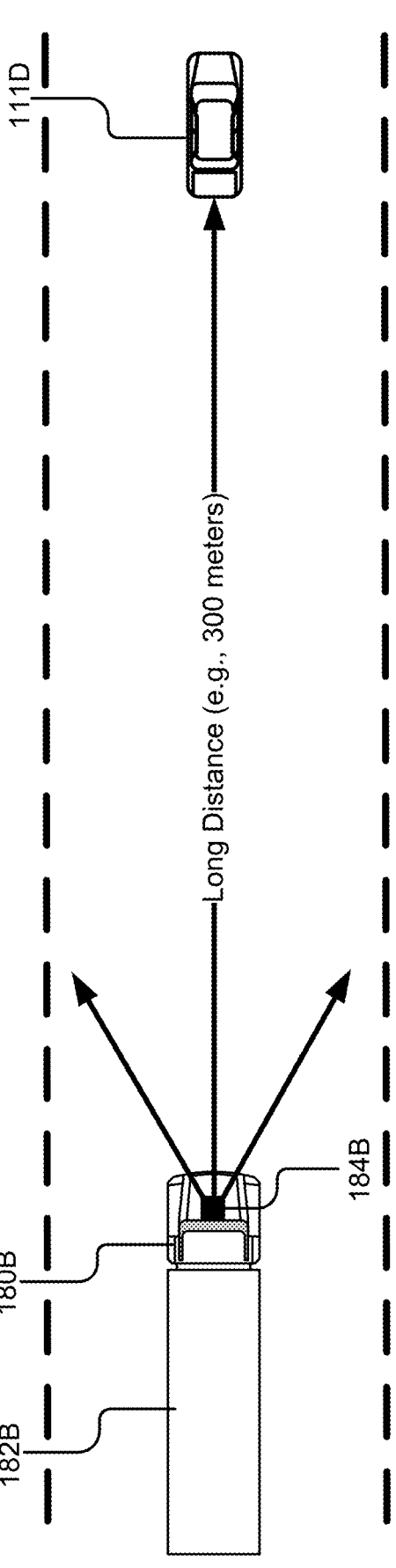
FIG. 1D is a block diagram illustrating an example of a system environment for autonomous commercial trucking vehicles, according to some implementations.

FIG. 1D is a block diagram illustrating an example of a system environment for autonomous commercial trucking vehicles, according to some implementations. The environment 100D includes the same components (e.g., commercial truck 180B, cargo 182B, LIDAR system 184B, etc.) that are included in environment 100B.

The environment 100D includes an object 111D (shown in FIG. 1D as another vehicle) that is within a distance range that is more than 150 meters from the commercial truck 180B. As shown, the LIDAR system 184B in environment 100D may be configured to detect an object (e.g., another vehicle, a bicycle, a tree, street signs, potholes, etc.) at a distance (e.g., 300 meters) from the commercial truck 180B.

In commercial trucking applications, it is important to effectively detect objects at all ranges due to the increased weight and, accordingly, longer stopping distance required for such vehicles. FM LIDAR systems (e.g., FMCW and/or FMQW systems) or PM LIDAR systems are well-suited for commercial trucking applications due to the advantages described above. As a result, commercial trucks equipped with such systems may have an enhanced ability to safely move both people and goods across short or long distances, improving the safety of not only the commercial truck but of the surrounding vehicles as well. In various implementations, such FM or PM LIDAR systems can be used in semi-autonomous applications, in which the commercial truck has a driver and some functions of the commercial truck are autonomously operated using the FM or PM LIDAR system, or fully autonomous applications, in which the commercial truck is operated entirely by the FM or LIDAR system, alone or in combination with other vehicle systems.

Continuous Wave Modulation and Quasi-Continuous Wave Modulation

In a LIDAR system that uses CW modulation, the modulator modulates the laser light continuously. For example, if a modulation cycle is 10 seconds, an input signal is modulated throughout the whole 10 seconds. Instead, in a LIDAR system that uses quasi-CW modulation, the modulator modulates the laser light to have both an active portion and an inactive portion. For example, for a 10 second cycle, the modulator modulates the laser light only for 8 seconds (sometimes referred to as, "the active portion"), but does not modulate the laser light for 2 seconds (sometimes referred to as, "the inactive portion"). By doing this, the LIDAR system may be able to reduce power consumption for the 2 seconds because the modulator does not have to provide a continuous signal.

In Frequency Modulated Continuous Wave (FMCW) LIDAR for automotive applications, it may be beneficial to operate the LIDAR system using quasi-CW modulation where FMCW measurement and signal processing methodologies are used, but the light signal is not in the on-state (e.g., enabled, powered, transmitting, etc.) all the time. In some implementations, Quasi-CW modulation can have a duty cycle that is equal to or greater than 1% and up to 50%. If the energy in the off-state (e.g., disabled, powered-down, etc.) can be expended during the actual measurement time then there may be a boost to signal-to-noise ratio (SNR) and/or a reduction in signal processing requirements to coherently integrate all the energy in the longer time scale.

LIDAR System for Autonomous Vehicles

FIG. 2 is a block diagram illustrating an example environment of a LIDAR sensor system for autonomous vehicles, according to some implementations. The environment 200 includes a LIDAR sensor system 201 that includes a transmit (Tx) path and a receive (Rx) path. The Tx path includes one or more Tx input/output ports (not shown in FIG. 2) and the Rx path includes one or more Rx input/output ports (not shown in FIG. 2).

In some implementations, a semiconductor substrate and/or semiconductor package may include the Tx path and the Rx. In some implementations, the semiconductor substrate and/or semiconductor package may include at least one of silicon photonics circuitry, programmable logic controller (PLC), or III-V semiconductor circuitry.

In some implementations, a first semiconductor substrate and/or a first semiconductor package may include the Tx path and a second semiconductor substrate and/or a second semiconductor package may include the Rx path. In some arrangements, the Rx input/output ports and/or the Tx input/output ports may occur (or be formed/disposed/located/placed) along one or more edges of one or more semiconductor substrates and/or semiconductor packages.

The environment 200 includes one or more transmitters 216 and one or more receivers 222.

The environment 200 includes one or more optics 210 (e.g., an oscillatory scanner, a unidirectional scanner, a Risley prism, a circulator optic, and/or a beam collimator, etc.) that are coupled to the LIDAR sensor system 201. In some implementations, the one or more optics 210 may be coupled to the Tx path via the one or more Tx input/output ports. In some implementations, the one or more optics 210 may be coupled to the Rx path via the one or more Rx input/output ports.

The environment 200 includes a vehicle control system 120 (e.g., vehicle control system 120 in FIG. 1A) that is coupled to the LIDAR sensor system 201. In some implementations, the vehicle control system 120 may be coupled to the Rx path via the one or more Rx input/output ports.

The Tx path may include a laser source 202, a modulator 204A, a modulator 204B, an amplifier 206, and one or more transmitters 216. The Rx path may include one or more receivers 222, a mixer 208, a detector 212, a transimpedance amplifier (TIA) 214, and one or more analog-to-digital converters (ADCs). Although FIG. 2 shows only a select number of components and only one input/output channel; the environment 200 may include any number of components and/or input/output channels (in any combination) that are interconnected in any arrangement to facilitate combining multiple functions of a LIDAR system, to support the operation of a vehicle.

The laser source 202 may be configured to generate a light signal (or beam) that is derived from (or associated with) a local oscillator (LO) signal. In some implementations, the light signal may have an operating wavelength that is equal to or substantially equal to 1550 nanometers. In some implementations, the light signal may have an operating wavelength that is between 1400 nanometers and 1440 nanometers.

The laser source 202 may be configured to provide the light signal to the modulator 204A, which is configured to modulate a phase and/or a frequency of the light signal based on a first radio frequency (RF) signal (shown in FIG. 2 as, "RF1") and using Continuous Wave (CW) modulation or quasi-CW modulation to generate a modulated light signal. The modulator 204A may be configured to send the modulated light signal to the amplifier 206. The amplifier 206 may be configured to amplify the modulated light signal to generate an amplified light signal to the optics 210 via the one or more transmitters 216. The one or more transmitters 216 may include one or more optical waveguides or antennas.

The optics 210 may be configured to steer the amplified light signal that it receives from the Tx path into an environment within a given field of view toward an object 218, may receive a returned signal reflected back from the object 218, and provide the returned signal to the mixer 208 of the Rx path via the one or more receivers 222. The one or more receivers 222 may include one or more optical waveguides or antennas. In some arrangements, the transmitters 216 and the receivers 222 may constitute one or more transceivers (not shown in FIG. 2). In some arrangements, the one or more transceivers may include a monostatic transceiver or a bistatic transceiver.

The laser source 202 may be configured to provide the LO signal to the modulator 204B, which is configured to modulate a phase and/or a frequency of the LO signal based on a second RF signal (shown in FIG. 2 as, "RF2") and using Continuous Wave (CW) modulation or quasi-CW modulation to generate a modulated LO signal and send the modulated LO signal to the mixer 208 of the Rx path.

The mixer 208 may be configured to mix (e.g., combine, multiply, etc.) the modulated LO signal with the returned signal to generate a down-converted signal and send the down-converted signal to the detector 212. In some arrangements, the mixer 208 may be configured to send the modulated LO signal to the detector 212.

The detector 212 may be configured to generate an electrical signal based on the down-converted signal and send the electrical signal to the TIA 214. In some arrangements, the detector 212 may be configured to generate an electrical signal based on the down-converted signal and the modulated signal.

The TIA 214 may be configured to amplify the electrical signal and send the amplified electrical signal to the vehicle control system 120 via the one or more ADCs 220.

In some implementations, the TIA 214 may have a peak noise-equivalent power (NEP) that is less than 5 picowatts per square root hertz (i.e., $5\times10\text{-}12$ watts per square root hertz). In some implementations, the TIA 214 may have a gain between 4 kiloohms and 25 kiloohms.

In some implementations, detector 212 and/or TIA 214 may have a 3 decibel bandwidth between 80 kilohertz (kHz) and 450 megahertz (MHz).

The vehicle control system 120 may be configured to determine a distance to the object 218 and/or measure the velocity of the object 218 based on the one or more electrical signals that it receives from the TIA via the one or more ADCs 220.

In some implementations, modulator 204A and/or modulator 204B may have a bandwidth between 400 megahertz (MHz) and 1000 (MHz).

In some implementations, the modulator 204A may be configured to send a first modulated light (optical) signal and a second modulated light (optical) signal to the amplifier 206. The amplifier 206 may be configured to amplify the first and second modulated light signals to generate amplified light signals to the optics 210 via the transmitters 216. The optics 210 may be configured to steer the first and second modulated light signals that it receives from the Tx path into an environment within a given field of view toward an object 218, may receive corresponding first and second returned signals reflected back from the object 218, and provide the first and second returned signals to the mixer 208 of the Rx path via the receivers 222. The modulator 204B may be configured to generate (1) a first modulated LO signal associated with the first modulated light signal and (2) a second modulated LO signal associated with the second modulated light signal, and send the first and second modulated LO signals to the mixer 208 of the Rx path. The mixer 208 may be configured to pair (e.g., associate, link, identify, etc.) the first returned light signal and the first modulated LO signal, and mix (e.g., combine, multiply, etc.) the first returned light signal and the first modulated LO signal to generate a first down-converted signal and send the first down-converted signal to the detector 212. Similarly, the mixer 208 may be configured to pair the second returned light signal and the second modulated LO signal, and mix the second returned light signal and the second modulated LO signal to generate a second down-converted signal and send the second down-converted signal to the detector 212. The detector 212 may be configured to generate first and second electrical signals based on the first and second down-converted signal, respectively. The vehicle control system 120 may be configured to determine a distance to the object 218 and/or measure the velocity of the object 218 based on the first and second electrical signals, received via TIA 214 and ADCs 220.

A LIDAR System Including an Integrated Light Source

In some implementations, a LIDAR sensor system may include a processor, a laser source for providing a light signal (sometimes referred to as, "beam"), one or more modulators for modulating a phase and/or a frequency of the light signal using Continuous Wave (CW) modulation or quasi-CW modulation, an optical amplifier for amplifying the modulated signal to send the signal up to a certain range, a transceiver and/or optics (e.g., a mirror scanner) for steering the amplified signal to an environment within a given field of view.

In some implementations, a LIDAR sensor system (e.g., FMCW or other coherent LIDAR sensor systems) may include a processor, a photonics device (e.g., photonics assembly) as a first device, a transmit (TX)/receive (RX)/optics device (e.g., free space optics assembly) including a plurality of sets of transceivers as a second device, and a LIDAR processing device including one or more ADCs (e.g., LIDAR computation assembly) as a third device. In some implementations, the LIDAR sensor system may be configured to generate and transmit M×N optical signals (e.g., light beams, light signals) where M and N are integers (e.g., M≥2, N≥8), by alternately turning on the photonics device and turning on the TX/RX/optics device (or a set of N transceivers thereof) M times (e.g., by temporally multiplexing M sets of N transceivers) to transmit M×N optical signals to an environment. In response to transmitting the optical signals, the plurality of sets of transceivers (e.g., M×N transceivers) may receive returned signals in M×N channels, and the LIDAR processing device may then process the returned optical signals in M×N channels. In this manner, the LIDAR processing device (e.g., ADCs) can be efficiently shared among the plurality of sets of transceivers (e.g., M sets of N transceivers).

In some implementations, the photonics device of the LIDAR sensor system may include a laser source, a seed device (e.g., photonics seed module), and a plurality of optical TX amplifiers (e.g., photonics TX amplifier module). In some implementations, the laser source may be a laser diode (e.g., Distributed Feedback (DFB) laser diode). In some implementations, the laser source may generate a laser beam having a wavelength in a range between 1530 nm and 1565 nm.

In some implementations, the plurality of TX amplifiers may include, at input sides thereof, a plurality of apertures to which the seed device may provide a single optical signal. In some implementations, the seed device may provide a TX optical signal to the plurality of TX amplifiers via one or more splitters. The one or more splitters may be one or more fiber splitters. A splitter may be coupled to an input of an optical amplifier using one of butt coupling or lens coupling. For example, in butt coupling, an input of an optical amplifier may be facing directly towards an output (e.g., waveguide ends) of the seed device. In lens coupling, an input of an optical amplifier and an output of the seed device may be coupled using a lens, e.g., ball lens. In this manner, the seed device can seed multiple TX amplifiers (e.g., tapered SOAs or a tapered SOA array) with multiple apertures with one optical signal.

Each of the plurality of TX amplifiers may receive a TX optical signal and output an amplified TX optical signal to one or more transceivers of the TX/RX/optics device. In some implementations, each TX amplifier may provide, based on the amplified TX optical signals via a splitter, a plurality of amplified TX optical signals to the one or more transceivers. In some implementations, one or more amplified TX optical signals may be output to the one or more transceivers via MPO connectors (e.g., 16 fibers for 16 TX optical signals).

In some implementations, the plurality of TX amplifiers may include a plurality of optical amplifiers. The optical amplifiers may include a semiconductor optical amplifier (SOA), a fiber Raman and Brillouin amplifier, or an erbium-doped fiber amplifier (EDFA). For example, the plurality of TX amplifiers may include one or more EDFA with 4 W of input power level. In some implementations, the plurality of TX amplifiers may include an array of optical amplifiers. The optical amplifiers may include an SOA array, an array of fiber Raman and Brillouin amplifiers, or an EDFA array.

In some implementations, the plurality of TX amplifiers may include a plurality of tapered optical amplifiers (TPAs), each containing a tapered section in which a cross-section area of an amplified beam is gradually increased. The plurality of TPAs may include one or more of tapered SOAs, tapered fiber Raman and Brillouin amplifiers, or tapered EDFAs. The plurality of TPAs may include one or more of a tapered SOA array, an array of tapered fiber Raman and Brillouin amplifiers, or a tapered EDFA array.

In some implementations, by using SOAs for the coherent signal generation, a high level of integration may be achieved. For example, a large number of SOAs can be scaled-down and placed onto a single semiconductor (silicon photonics) chip, which may result in improvements in not only speed (e.g., less latency) and power consumption (e.g., the power may be more efficiently routed between the SOAs), but also improvements in the manufacturing process. That is, scaling down the coherent signal generator (sometimes referred to as, "signal processing system") onto a single semiconductor chip means that the semiconductor chip (e.g., silicon) may be smaller in size, thereby decreasing the likelihood of a manufacturing defect affecting the performance of the coherent signal generator.

In some implementations, the photonics device may include at least one of silicon photonics circuitry, programmable logic controller (PLC), III-V semiconductor circuitry, or micro-optics circuitry. The III-V semiconductors may include at least one of indium nitride (InN) or gallium arsenide (GaAs). In some implementations, the PLC may be glass-based PLC. Silicon photonics circuitry may include silicon nitride circuitry (e.g., $Si_3N_4$ based circuitry). In some implementations, the seed device may include at least one of III-V semiconductor circuitry or micro-optics circuitry. In some implementations, the seed device may be a chip or integrated circuit including at least one of III-V semiconductor circuitry or micro-optics circuitry. In some implementations, the plurality of TX amplifiers may include at least one of III-V semiconductor circuitry or micro-optics circuitry. In some implementations, the plurality of TX amplifiers may include a chip or integrated circuit including at least one of III-V semiconductor circuitry or micro-optics circuitry.

In some implementations, the TX/RX/optics device of the LIDAR sensor system may include one or more transceivers (e.g., M×N transceivers each transmitting/receiving a single optical signal), one or more optical mixers, one or more photo-detectors, one or more optics devices (e.g., collimator), and/or one or more laser scanners (e.g., Galvo scanner, polygon scanner, etc.). Each of the one or more transceivers may be a monostatic transceiver, or a bistatic transceiver including TX waveguide (or antenna) and RX waveguide (or antenna). The one or more optics devices may include one or more collimators configured to narrow/limit a plurality of optical signals (e.g., 16 light beams). The one or more optical mixers may optically mix one or more returned optical signals with an LO signal received from the seed device, to generate one or more mixed optical signals. The one or more photo-detectors may receive the one or more mixed optical signals to generate one or more electrical signals. The one or more laser scanners may be controlled by the LIDAR processing device (e.g., using software drivers).

In some implementations, the TX/RX/optics device may include at least one of silicon photonics circuitry, PLC, III-V semiconductor circuitry, or micro-optics circuitry. In some implementations, one or more transceivers of the TX/RX/ optics device may include at least one of silicon photonics circuitry or PLC. In some implementations, the one or more transceivers may be a chip or integrated circuit including at least one of silicon photonics circuitry or PLC.

In some implementations, the LIDAR processing device of the LIDAR sensor system (as a second device) may include one or more ADCs or a multi-channel ADC (e.g., 16 ADCs or 16-channel ADC) configured to generate one or more digital signals based on one or more returned optical signals, and provide the digital signals to an autonomous vehicle control system. The LIDAR processing device may include one or more amplifiers, and/or one or more digital-to-analog converters (DACs). The LIDAR processing device may be a computing system (e.g., computing system 900 in FIG. 9) that can execute software modules stored in a memory. For example, the LIDAR processing device may store software drivers to control the one or more scanners of the TX/RX/optics device (e.g., Galvo scanner, polygon scanner, etc.).

In some implementations, the LIDAR processing device may include a radio-frequency (RF) chip (or integrated circuit) implementing one or more ADCs, one or more amplifiers, and/or one or more DACs. The RF chip may be an RF system-on-chip (RF SoC). The RF chip may be an RF system-on-chip field-programmable gate array (FR SoC FPGA). In some implementations, the RF chip may include one or more radio frequency analog to digital converters (RF-ADCs), one or more radio frequency digital to analog converters (RF-DACs), etc. In some implementations, the RF-ADCs and the RF-DACs may be configured in pairs for real and imaginary in-phase/quadrature (I/Q) data. For example, the LIDAR processing device may provide 2-channel RF signals (e.g., I/Q data) to the seed device for modulation (e.g., I/Q modulation). The RF chip may communicate with a vehicle or a vehicle control system (e.g., autonomous vehicle control system) via a Gigabit Ethernet (GigE) interface. In some implementations, the LIDAR processing device may include a functional safety (FuSa) system which is implemented as circuitry or software in the LIDAR processing device.

FIGS. 3A-3D are schematic diagrams illustrating examples of transmit (TX) amplifier assemblies used in a LIDAR sensor system, according to some implementations.

Figures 3A, 3B, 3C, 3D:
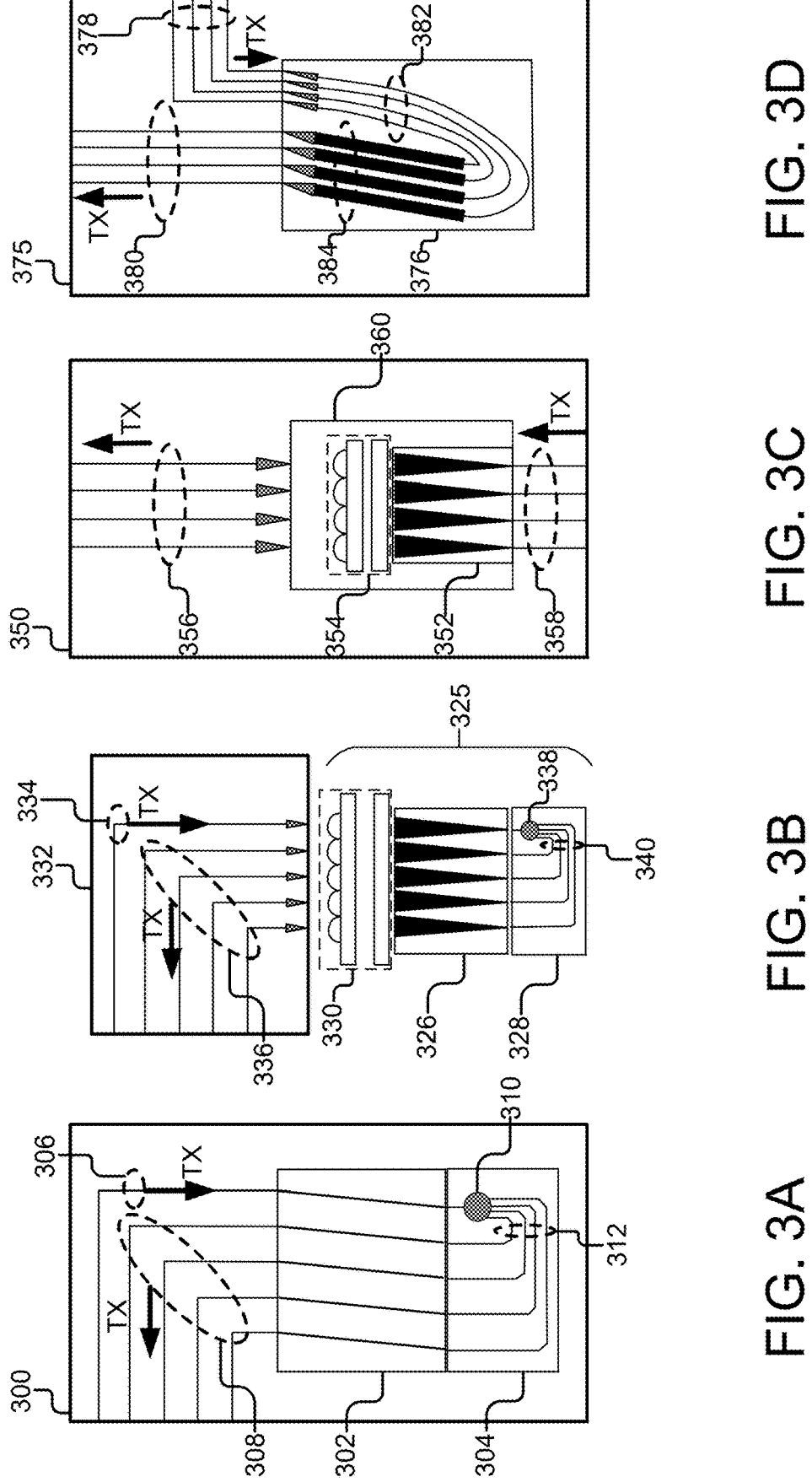
FIGS. 3A-3D are schematic diagrams illustrating examples of transmit (TX) amplifier assemblies used in a LIDAR sensor system, according to some implementations.

Referring to FIG. 3A, an example TX amplifier assembly 300 may include a configuration of a first chip 302 and a second chip 304. In some implementations, the first chip 302 may include an optical amplifier array. For example, the optical amplifier array in the first chip 302 may include an array of five (5) semiconductor optical amplifiers (SOAs). The SOAs may be at least one of single-mode SOAs or tapered SOAs. In some implementations, a second chip 304 may include a splitter 310 and an array 312 of U-shaped components coupled to the output of the splitter 310. In this example, the components in the array 312 have a U-shape with any suitable bending radius. However, the shape of the components is not limited to the U-shape. The components can have any suitable shape where the components change the direction of the signal transfer route. For example, V-shape or L-shape (or reverse L-shape) can be also used as a shape of the components in the array 312. The input of the splitter 310 may be coupled to the input side of an optical amplifier (e.g., the rightmost optical amplifier) in the first chip 302. In one example, the array 312 of U-shaped components in the second chip 304 may include an array of four (4) passive waveguide components. The first chip 302 may include, at input sides thereof, a plurality of apertures (not shown) to which the corresponding apertures of the second chip 304 may be coupled by hybrid integration. For example, the corresponding waveguide ends of the optical amplifier array (e.g., implemented in III-V semiconductor circuitry) in the first chip 302 and the corresponding waveguide ends of the U-shaped components (e.g., implemented in silicon nitride (Si$_3$N$_4$)-based circuitry) in the second chip 304 may be directly aligned and butt-coupled (edge coupling).

This configuration of the first chip 302 and the second chip 304 allows an input side of one of the array of optical amplifiers to be coupled to the input sides of the others in the array of optical amplifiers. For example, an input side of the first optical amplifier (e.g., the rightmost optical amplifier) in the first chip 302 is coupled to the input sides of the second-to-fifth optical amplifiers (e.g., the remaining four optical amplifiers) in the first chip 302 through the arrangement of splitter 310 and the array 312 of U-shaped components of the second chip 304. The first chip 302 may include, at output sides thereof, a plurality of apertures (not shown) to which the set of optical input/output (I/O) paths 306, 308 may be coupled by hybrid integration. For example, the corresponding waveguide ends of the optical amplifier array (e.g., implemented in III-V semiconductor circuitry) in the first chip 302 and the corresponding waveguide ends of the optical I/O paths 306, 308 (e.g., implemented in silicon nitride (Si$_3$N$_4$)-based circuitry) may be directly aligned and butt-coupled (edge coupling). In some implementations, a seed device (not shown) may provide a first TX optical signal to an output side of the first optical amplifier (e.g., the rightmost optical amplifier) through the right-most optical input path 306 such that (1) the first TX optical is inputted to the input sides of the second-to-fifth optical amplifiers through the arrangement of the splitter 310 and the array 312 of U-shaped components in the second chip 304, and (2) the second-to-fifth optical amplifiers provide four amplified TX optical signals on their output sides through the remaining optical output paths 308 to one or more transceivers. The splitter 310 in the second chip 304 may be configured to split the first TX optical signal received from the input side of the first optical amplifier (e.g., the rightmost optical amplifier) into four TX optical signals and the array 312 of U-shaped components may be configured to couple the four corresponding TX optical signals into the input sides of the second-to-fifth optical amplifiers in the first chip 302 for amplification. The configuration of the first chip 302 and the second chip 304 may serve as an optical gain block for splitting and amplifying an optical signal coupled into the optical path 306. An advantage of this configuration is all the optical I/O paths 306, 308 are on one particular side of the first chip 302 for efficient coupling of optical signals in and out of the first chip 302 for amplification. This is made possible by the arrangement of the splitter 310 and the array 312 of U-shaped components in the second chip 304 to split and turn around the TX optical signals (e.g., reversal of signal direction) into the inputs of the optical amplifiers in the first chip 302. Another advantage of this configuration is the improvement in the throughput of wafer level assembly of both the first chip 302 and the second chip 304 on the main integrated chip (e.g. silicon photonics chip) hosting a plurality of transceivers.

Referring to FIG. 3A, in some implementations, the set of optical I/O paths 306, 308 may be passive waveguides implemented in silicon photonics circuitry (e.g., silicon nitride (Si$_3$N$_4$)-based circuitry). The array of optical amplifiers in the first chip 302 may be implemented in at least one of silicon photonics circuitry, programmable logic controller (PLC), or III-V semiconductor circuitry. The array 312 of U-shaped components and the splitter 310 in the second chip 304 may be implemented in at least one of silicon photonics circuitry (e.g., silicon nitride (Si$_3$N$_4$)-based circuitry), programmable logic controller (PLC), or III-V semiconductor circuitry. In some implementations, the example TX amplifier assembly 300 may be implemented on-chip of the main integrated chip hosting the plurality of transceivers.

Referring to FIG. 3B, another example TX amplifier assembly 325 may include a configuration of a first chip 326, a second chip 328, and a micro-lens array 330. In some implementations, the first chip 326 may include an array of five (5) tapered optical amplifiers (TPAs). In one example, the TPA may include a tapered semiconductor optical amplifier (TSOA). The second chip 328 may include a splitter 338 and an array 340 of U-shaped components coupled to the output of the splitter 338. In one example, the array 340 of U-shaped components in the second chip 328 may include an array of four (4) passive waveguide components. It will be understood that the elements of the second chip 328 in FIG. 3B are the same or similar to the elements of the second chip 304 in FIG. 3A, so descriptions for these elements are not repeated here. For example, the characteristics and functionalities of the splitter 338 and the array 340 of U-shaped components of the second chip 328 in FIG. 3B are similar to those described above with respect to FIG. 3A. The first chip 326 may include, at input sides thereof, a plurality of apertures (not shown) to which the corresponding apertures of the second chip 328 may be coupled by hybrid integration. For example, the corresponding waveguide ends of the TPAs (e.g., implemented in III-V semiconductor circuitry) in the first chip 326 and the corresponding waveguide ends of the U-shaped components (e.g., implemented in silicon nitride ($Si_3N_4$)-based circuitry) in the second chip 328 may be directly aligned and butt-coupled (edge coupling). This configuration of the first chip 326 and the second chip 328 allows an input side of the first TPA (e.g., the rightmost TPA) to be coupled to input sides of the second-to-fifth TPAs (e.g., the remaining 4 TPAs). The first chip 326 may include, at output sides thereof, a plurality of apertures (not shown) to which a set 332 of optical input/output (I/O) paths may be coupled via micro-lens array 330. With this configuration, a TX optical signal transmitted along the optical input path 334 is received at the output side of the first TPA through the micro-lens array 330 and provided to the input sides of the second-to-fifth TPAs through the arrangement of the splitter 338 and the array 340 of U-shaped components in the second chip 328 so that the second-to-fifth TPAs may output four (4) amplified TX optical signals through the micro-lens array 330 to the array of four (4) optical output paths 336. The TX amplifier assembly 325 may serve as an optical gain block for splitting and amplifying an optical signal coupled into the optical path 334. An advantage of the configuration of TX amplifier assembly 325 is all the optical I/O paths 334, 336 are on one particular side of the TX amplifier assembly 325 for efficient coupling of optical signals in and out of the TX amplifier assembly 325 for amplification. This is made possible by the arrangement of the splitter 338 and the array 340 of U-shaped components in the second chip 328 to split and turn around the TX optical signals (e.g., reversal of signal direction) into the inputs of the TPAs in the first chip 326.

Referring to FIG. 3B, in some implementations, the set 332 of optical I/O paths may be passive waveguides implemented in silicon photonics circuitry (e.g., silicon nitride ($Si_3N_4$)-based circuitry). The array of TPAs in the first chip 326 may be implemented in at least one of silicon photonics circuitry, programmable logic controller (PLC), or III-V semiconductor circuitry. The array 340 of U-shaped components and the splitter 338 in the second chip 328 may be implemented in at least one of silicon photonics circuitry (e.g., silicon nitride ($Si_3N_4$)-based circuitry), programmable logic controller (PLC), or III-V semiconductor circuitry. The plurality of lenses in the micro-lens array 330 may be implemented in micro-optics circuitry. In some implementations, the example TX amplifier assembly 325 may be implemented off-chip from the main integrated chip hosting the plurality of transceivers.

Referring to FIG. 3C, another example TX amplifier assembly 350 may include a configuration of a chip 352 and micro-lens array 354. The chip 352 may include an optical amplifier array. In one example, the optical amplifier array may be an array of four (4) high power and high gain tapered semiconductor optical amplifiers (TSOAs). In some implementations, the example TX amplifier assembly 350 precludes the usage of a U-shaped passive waveguide component in association with the optical amplifier array in chip 352. The micro-lens array 354 may be configured to couple the output sides of the chip 352 to an array or bundle 356 of optical output paths (which may be connected to a plurality of transceivers). The chip 352 may include, at input sides thereof, a plurality of apertures (not shown) to which the corresponding array or bundle 358 of optical input paths may be coupled by hybrid integration. For example, the corresponding waveguide ends of the TSOAs (e.g., implemented in III-V semiconductor circuitry) in the chip 352 and the corresponding waveguide ends of the bundle 358 of optical input paths (e.g., implemented in silicon nitride ($Si_3N_4$)-based circuitry) may be directly aligned and butt-coupled (edge coupling). A seed device (not shown) may provide an optical signal (e.g., TX optical signal) to the plurality of apertures of the chip 352 at the input sides thereof. For example, the seed device may generate, based on a single TX optical signal, a plurality of TX optical signals using one or more splitters (not shown in FIG. 3C), and provide the plurality of TX optical signals to the chip 352 via the bundle 358 of optical input paths. With this configuration, the plurality of TX optical signals is received at the input sides of the optical amplifier array so that the optical amplifier array may output the corresponding plurality of amplified TX optical signals and couple them through the micro-lens array 354 to the bundle 356 of optical output paths.

Referring to FIG. 3C, in some implementations, the bundle 358 of optical input paths and the bundle 356 of optical output paths may be passive waveguides implemented in silicon photonics circuitry (e.g., silicon nitride ($Si_3N_4$)-based circuitry). The chip 352 including tapered optical amplifiers (e.g., tapered SOAs) may be implemented in at least one of silicon photonics circuitry, programmable logic controller (PLC), or III-V semiconductor circuitry. The plurality of lenses in the micro-lens array 354 may be implemented in micro-optics circuitry. In some implementations, the example TX amplifier assembly 350 including the chip 352 and the micro-lens array 354 may be deposited into an opening 360 on a main integrated chip hosting the plurality of transceivers.

Referring to FIG. 3D, another example TX amplifier assembly 375 may include a chip 376. In some implementations, the chip 376 may be fabricated to integrate an optical amplifier array 384 with an array 382 of U-shaped components. In this example, the components in the array 382 have a U-shape. However, the shape of the components in the array 382 is not limited to the U-shape. The components can have any suitable shape where the components change the direction of the signal transfer route. For example, V-shape or L-shape (or reverse L-shape) can also be used as a shape of the components in the array 382. In other implementations, the chip 376 may also be fabricated to integrate the optical amplifier array 384 with the array 382 of U-shaped components and other optical components, such as a splitter, etc. In one example, the optical amplifier array 384 in the chip 376 may include an array of four (4) semiconductor optical amplifiers (SOAs). The SOAs may be at least one of single-mode SOAs or tapered SOAs. Each SOA may be a high power SOA with a high wall plug efficiency that is operable at high temperatures. For example, the output optical power of the SOA may be at least 200 milliwatts with a wall plug efficiency (e.g., ratio of the output optical power to the input electrical power) of at least 15 percent. An advantage of using this type of SOA is it allows for the optical modes in the SOA and the optical waveguides to be similar which is beneficial for optical packaging. For example, the optical mode of each SOA may be sufficiently large to facilitate hybrid integration of the optical amplifier array 384 and the optical waveguides of the main integrated chip (not shown). In another example, the array 382 of U-shaped components may include an array of four (4)

passive waveguide components. The chip 376 may include a first plurality of apertures (not shown) that couple to an array or bundle 378 of optical input paths via hybrid integration. For example, the corresponding waveguide ends of the U-shaped components in the array 382 (e.g., implemented in III-V semiconductor circuitry) within the chip 376 and the corresponding waveguide ends of the bundle 378 of optical input paths (e.g., implemented in silicon nitride (Si₃N₄)-based circuitry) may be directly aligned and butt-coupled (edge coupling). The chip 376 may also include a second plurality of apertures (not shown) that couple to an array or bundle 380 of optical output paths via hybrid integration. For example, the corresponding waveguide ends of the optical amplifier array 384 (e.g., implemented in III-V semiconductor circuitry) within the chip 376 and the corresponding waveguide ends of the bundle 380 of optical output paths (e.g., implemented in silicon nitride (Si₃N₄)-based circuitry) may be directly aligned and butt-coupled (edge coupling). As shown in FIG. 3D, the integration of the array 382 of U-shaped components with the optical amplifier array 384 in the chip 376 enables the input and the output to be on a same side or end face (e.g., the top side in FIG. 3D) of the chip 376. An advantage of this is it lends to easy and efficient coupling of the optical signal in and out of the chip 376 as all the optical input and output paths are on one particular side of the chip 376. Another advantage is the improvement in throughput of wafer-level assembly and packaging of the SOA arrays on the main integrated chip (e.g., silicon photonics chip). For example, the throughput of wafer-level assembly is doubled. As shown in FIG. 3D, the U-shaped components in the array 382 may begin from the waveguide ends coupling to the bundle 378 of optical input paths on one side of the chip 376 and end at the input sides of the optical amplifier array 384 within the chip 376. The U-shaped components in the array 382 may bend with any suitable bending radius before coupling to the input sides of the optical amplifier array 384 in the chip 376. The optical amplifier array 384 integrated with the array 382 of U-shaped components in the chip 376 may serve as an optical gain block for providing amplification to optical signals coupled in from the optical waveguides of the main integrated chip. A seed device (not shown) may provide an optical signal (e.g., TX optical signal) to the plurality of apertures of the chip 376 at the input sides thereof. For example, the seed device may generate, based on a single TX optical signal, a plurality of TX optical signals using one or more splitters (not shown in FIG. 3C), and provide the plurality of TX optical signals to the chip 372 via the array 378 of optical input paths. The optical input paths are coupled to the input sides of the optical amplifier array 384 in the chip 376 via the integrated array 382 of U-shaped components. In this configuration, the integrated array 382 of U-shaped components receive the plurality of TX optical signals and route them to the input sides of the optical amplifier array 384 in the chip 376 for amplification so that the optical amplifier array 384 may output the corresponding plurality of amplified TX optical signals to the array 380 of optical output paths (which may be connected to a plurality of transceivers of the main integrated chip).

Referring to FIG. 3D, in some implementations, the array 378 of optical input paths and the array 380 of optical output paths may be passive waveguides implemented in silicon photonics circuitry (e.g., silicon nitride (Si₃N₄)-based circuitry). The chip 376 including the array 384 of optical amplifiers (e.g., SOAs) and the array 382 of U-shaped components may be implemented in at least one of silicon photonics circuitry, programmable logic controller (PLC), or III-V semiconductor circuitry. The plurality of lenses in the micro-lens array 354 may be implemented in micro-optics circuitry. In some implementations, the example TX amplifier assembly 375 may be implemented on-chip of the main integrated chip hosting the plurality of transceivers.

Figure 4B:
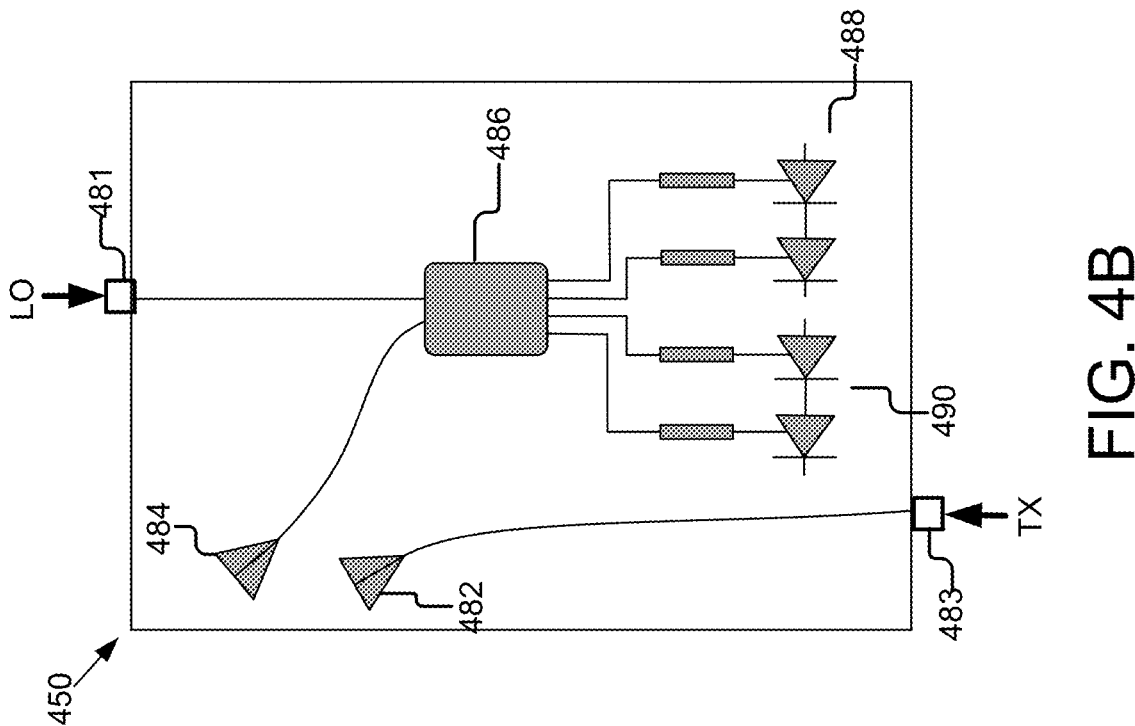
FIGS. 4A-4B are schematic diagrams illustrating examples of transceiver devices, according to some implementations.
Figure 4A:
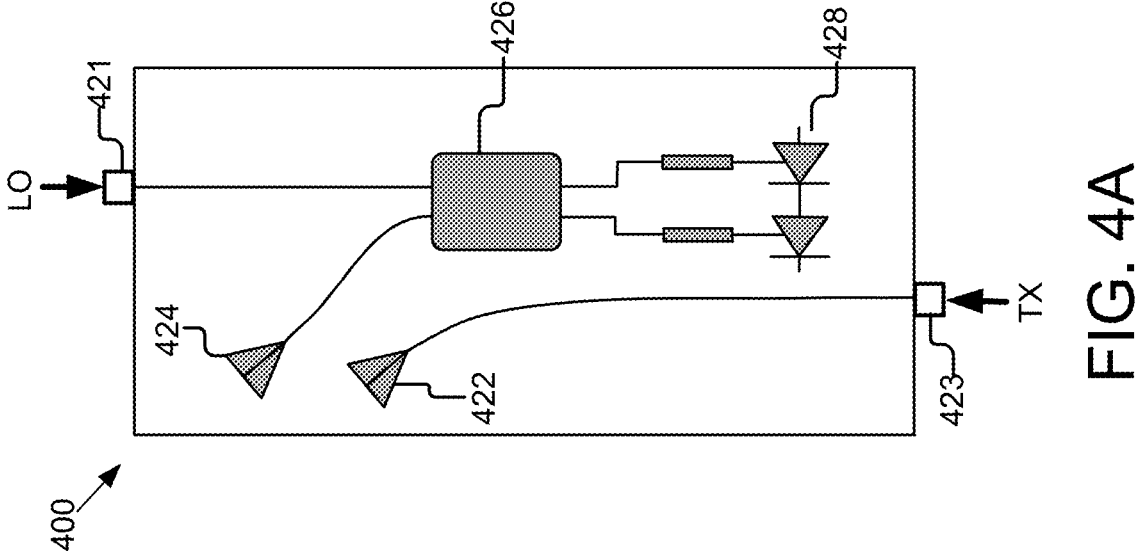

FIGS. 4A-4B are schematic diagrams illustrating examples of transceiver devices, according to some implementations.

Referring to FIG. 4A, an example single-channel transceiver 400 which can transmit/receive a single optical signal, may include a transmitter (or TX waveguide or antenna) 422, a receiver (or RX waveguide or antenna) 424, a 2×2 optical mixer 426, a configuration of photo-detectors 428, a TX input 423, and an LO input 421. The transmitter 422 may transmit a TX optical signal received at the TX input 423 to an environment. The receiver 424 may receive a returned signal reflected back from an object, and provide the returned signal to the 2×2 optical mixer 426. The 2×2 optical mixer 426 may receive an LO signal (from a seed device) at the LO input 421, and optically mix the returned optical signals with the LO signal, to generate a pair of mixed optical signals. For example, a detection scheme using the 2×2 optical mixer 426 may recover the amplitude of the returned optical signals. The configuration of photo-detectors 428 may receive the pair of mixed optical signals to generate an electrical signal to be output to a processing device in the LIDAR sensor system for detection and sensing.

Referring to FIG. 4B, another example single-channel transceiver 450 which can transmit/receive a single optical signal, may include a transmitter (or TX waveguide or antenna) 482, a receiver (or RX waveguide or antenna) 484, a 2×4 optical mixer 486, a first configuration of photo-detectors 488 and a second configuration of photo-detectors 490, a TX input 483, and an LO input 481. The transmitter 482 may transmit a TX optical signal received at the TX input 483 to an environment. The receiver 484 may receive a returned signal reflected back from an object, and provide the returned signal to the 2×4 optical mixer 486. The 2×4 optical mixer 486 may receive an LO signal (from a seed device) at the LO input 481, and optically mix the returned optical signals with the LO signal, to generate two pairs of mixed optical signals. The 2×4 optical mixer 486 (sometimes referred to as an "optical hybrid") facilitates coherent detection of optical signals. For example, a detection scheme using the 2×4 optical mixer 486 recovers both the amplitude and the phase of the returned optical signals. The first configuration of photo-detectors 488 may receive a first pair of mixed optical signals and the second configuration of photo-detectors 490 may receive a second pair of mixed optical signals to generate an electrical signal to be output to a processing device in the LIDAR sensor system for detection and sensing.

Referring to FIGS. 4A and 4B, in some implementations, each one of the transceiver 400 (and transmitter 422, receiver 424, 2×2 optical mixer 426, configuration of photo-detectors 428, LO input 421, and TX input 423, thereof) and transceiver 450 (and transmitter 482, receiver 484, 2×4 optical mixer 486, configurations of photo-detectors 488 and 490, LO input 481, and TX input 483, thereof) may be implemented in silicon photonics circuitry including silicon nitride (Si₃N₄)-based circuitry, III-V semiconductor circuitry, programmable logic controller (PLC), or combinations thereof. In some implementations, each one of the transceivers 400 and 450 may be implemented in a chip or integrated circuit including silicon photonics circuitry.

Figure 5:
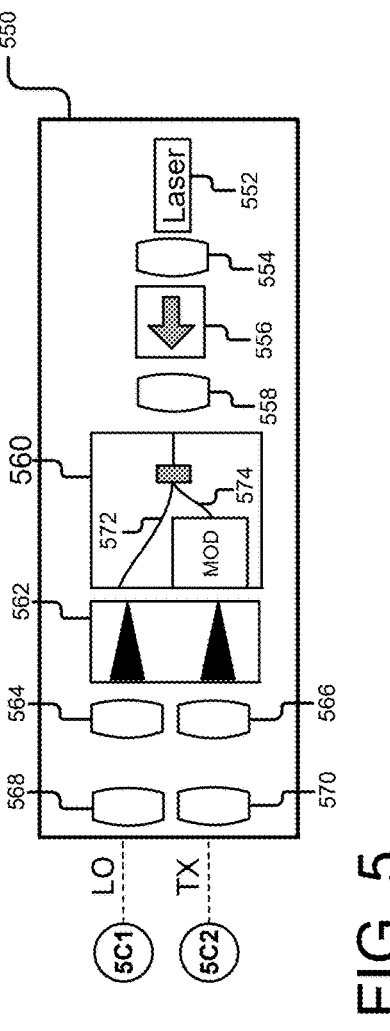
FIG. 5 is a schematic diagram illustrating an example architecture of a coherent LIDAR sensor system, according to some implementations.

FIG. 5 is a schematic diagram illustrating an example architecture of a coherent LIDAR sensor system 500, according to some implementations.

Referring to FIG. 5, a LIDAR sensor system 500 may include a seed device 550 and a transceiver/TX amplifier device 502. In some implementations, the seed device 550 may include a laser source 552, a first set of optics including a lens 554, an optical isolator 556, and a lens 558, a modulator 560 (e.g., I/Q modulator), a pair of tapered optical amplifiers (TPAs) 562, a second set of optics including lenses 564, 568, and a third set of optics including lenses 566, 570. The first set of optics including the lens 554, the optical isolator 556, and the lens 558 may form a common optical path. An upper branch 572 in the modulator 560, an upper TPA in the pair 562, and the second set of optics including the lenses 564, 568 may form an LO optical path, while a lower branch 574 in the modulator 560, a lower TPA in the pair 562, and the third set of optics including the lenses 566, 570 may form a TX optical path. With this configuration, the seed device 550 may generate, based on a light beam from the laser source 552, an LO signal through the common optical path and the LO optical path, and provide the LO optical signal to an LO input path 516 of the transceiver/TX amplifier device 502 using lens coupling. The seed device 550 may generate, based on a light beam from the laser source 552, a TX optical signal through the common optical path and the TX optical path, and provide the TX optical signal to a TX input path 518 of the transceiver/TX amplifier device 502 using lens coupling. In lens coupling, an input of transceiver/TX amplifier device 502 and an output of the seed device 550 may be coupled using a lens, e.g., ball lens.

In some implementations, the transceiver/TX amplifier device 502 may include an assembly of a plurality of TX amplifier arrays 506-1 . . . 506-8 and a plurality of U-shaped passive arrays 504-1 . . . 504-8. Each of the plurality of TX amplifier arrays 506-1 . . . 506-8 may be implemented in a chip which has configuration similar to that of the chip 302 in FIG. 3A. Each of the plurality of U-shaped passive arrays 504-1 . . . 504-8 may be implemented in a chip which has configuration similar to that of the chip 304 in FIG. 3A. The TX optical signal generated by the seed device 550 may be provided to the plurality of TX amplifier arrays via a multi-stage splitter assembly including one or more splitters 508, 510-1, 510-2, 510-3, and 510-4. In one example, the one or more splitters may be one or more fiber splitters. An output of a splitter (e.g., splitter 510-1) may be coupled to an input of an optical amplifier (e.g., TX amplifier array 506-1) using butt coupling. For example, in butt coupling, an input (e.g., waveguide ends) of an optical amplifier in the TX amplifier array 506-1 may be facing directly towards an output (e.g., waveguide ends) of the splitter 510-1. In this manner, the seed device can seed multiple TX amplifiers (e.g., SOAs or a SOA array) with multiple apertures with one optical signal.

In some implementations, the transceiver/TX amplifier device 502 may include a plurality of transceivers 512-1 . . . 512-32. Each of the plurality of transceivers may have configuration similar to that of the single-channel transceiver 400 in FIG. 4A. Each of the plurality of TX amplifier arrays (e.g., TX amplifier array 506-1) may output amplified TX optical signals to respective TX inputs of the plurality of transceivers (e.g., transceivers 512-1, 512-2, 512-3, 512-4) via a plurality of output optical paths (e.g., optical TX path bundle 520). For example, as shown in FIG. 5, the plurality of transceivers may include eight (8) sets of four (4) transceivers (M=8, N=4). With this configuration, a processor of the LIDAR sensor system may alternately turn on the seed device 550 and turn on the transceiver/TX amplifier device 502 M times during a period to transmit M×N TX optical signals to an environment. The processor may turn on the seed device 550 with a first duty cycle and turn on the transceiver/TX amplifier device 502 with a second duty cycle during the period to transmit M×N TX optical signals to the environment. The processor may temporally multiplex M sets of N transceivers so that a (selected) set of N transceivers may transmit N TX optical signals to the environment at M different times during the period. The processor may determine a sequence of M sets of N transceivers and perform time sequencing according to the determined sequence so that each of M sets of N transceivers may transmit N TX optical signals to the environment, according to the sequence at M different times during the period.

In some implementations, the LO signal generated by the seed device 550 may be provided to respective LO inputs of the plurality of transceivers (e.g., transceivers 512-1, 512-2, 512-3, 512-4) via a splitter (e.g., splitter 522) and a plurality of split optical LO paths (e.g., optical LO path bundle 514). With this configuration, the LIDAR sensor system 500 may be configured to generate and provide M×N LO signals to the plurality of transceivers. For example, the processor of the LIDAR sensor system 500 may (1) temporally multiplex M sets of N transceivers so that a (selected) set of N transceivers may receive N LO signals at M different times during a period, or (2) determine a sequence of M sets of N transceivers and perform time sequencing according to the sequence so that each of M sets of N transceivers may receive N LO signals, according to the sequence at M different times during the period. In some implementations, the seed device 550 may provide the same LO signal to the M sets of N transceivers substantially at the same time.

In some implementations, the transceiver/TX amplifier device 502 may be implemented in a chip or integrated circuit including at least one of silicon photonics circuitry, programmable logic controller (PLC), III-V semiconductor circuitry, or silicon nitride (Si$_3$N$_4$)-based circuitry. For example, each one of the plurality of transceivers 512-1, . . . , 512-32, the plurality of TX amplifier arrays 506-1 . . . 506-8, and the plurality of U-shaped passive arrays 504-1 . . . 504-8 may be implemented in silicon photonics circuitry, programmable logic controller (PLC), III-V semiconductor circuitry, silicon nitride (Si$_3$N$_4$)-based circuitry, or combinations thereof. In another example, the optical TX paths (e.g., 518, bundle 520, etc.) and the optical LO paths (e.g., 516, bundle 514, etc.) may be passive waveguides implemented in silicon photonics circuitry (e.g., silicon nitride (Si$_3$N$_4$)-based circuitry).

In some implementations, the seed device 550 may be implemented in a chip or integrated circuit including at least one of III-V semiconductor circuitry or micro-optics circuitry. For example, the laser source 552, the modulator 560, and the pair of TPAs 562 may be implemented in III-V semiconductor circuitry. The optical isolator 556 and lenses 554, 558, 564, 566, 568, 570 may be implemented in micro-optics circuitry.

An advantage of the example architecture of the coherent LIDAR sensor system 500 in FIG. 5 is that the wafer-level assembly of the plurality of TX amplifier arrays 506-1 . . . 506-8, and the plurality of U-shaped passive arrays 504-1 . . . 504-8 is easier and it improves chip assembly throughput.

Figure 6:
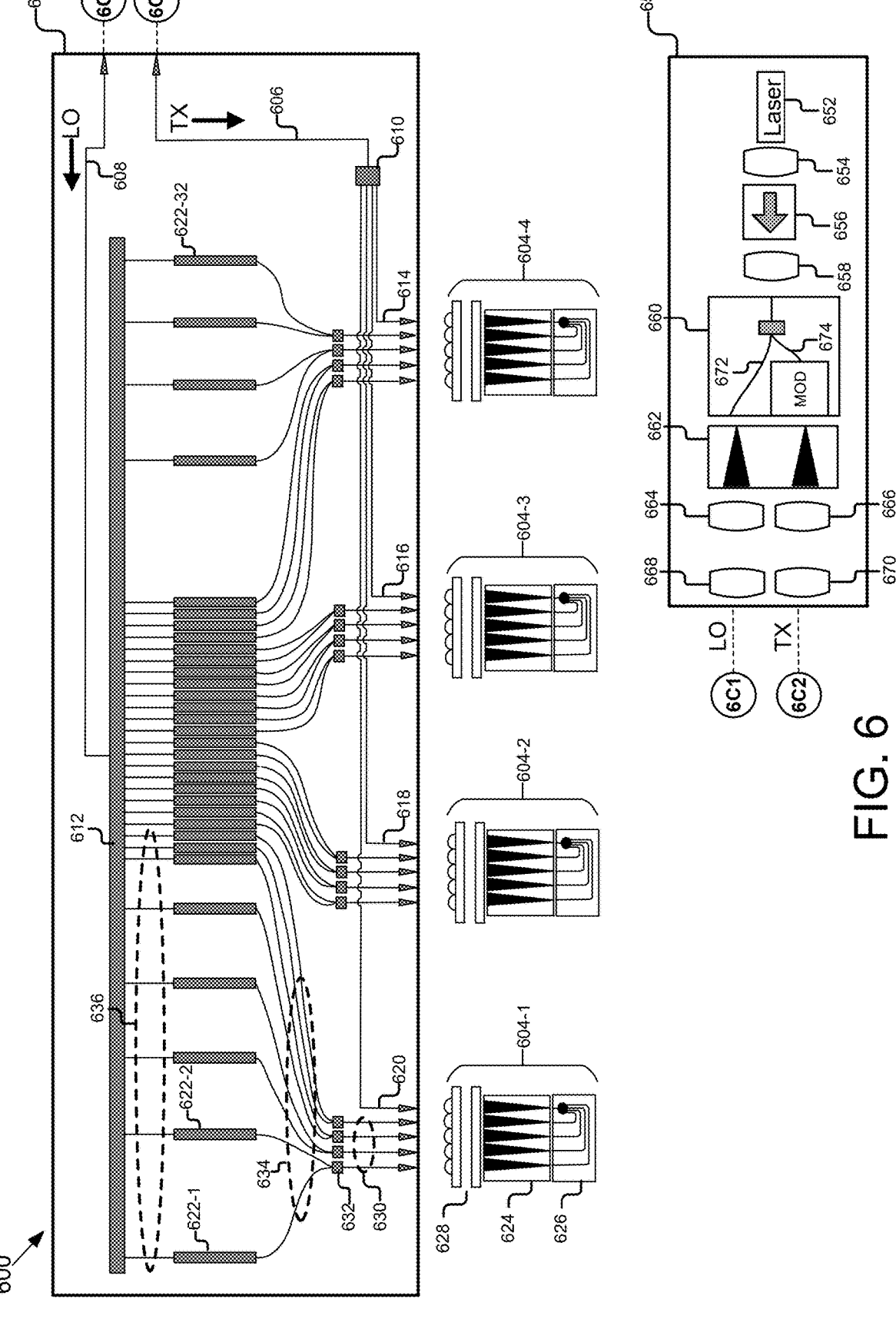
FIG. 6 is a schematic diagram illustrating another example architecture of a coherent LIDAR sensor system, according to some implementations.

FIG. 6 is a schematic diagram illustrating an example architecture of a coherent LIDAR sensor system 600, according to some implementations.

Referring to FIG. 6, a LIDAR sensor system 600 may include a seed device 650 and a transceiver/TX amplifier device 602. In some implementations, the seed device 650 may include a laser source 652, a first set of optics including a lens 654, an optical isolator 656, and a lens 658, a modulator 660 (e.g., I/Q modulator), a pair of tapered optical amplifiers (TPAs) 662, a second set of optics including lenses 664, 668, and a third set of optics including lenses 666, 670. The first set of optics including the lens 654, the optical isolator 656, and the lens 658 may form a common optical path. An upper branch 672 in the modulator 660, an upper TPA in the pair 662, and the second set of optics including the lenses 664, 668 may form an LO optical path, while a lower branch 674 in the modulator 660, a lower TPA in the pair 662, and the third set of optics including the lenses 666, 670 may form a TX optical path. With this configuration, the seed device 650 may generate, based on a light beam from the laser source 652, an LO signal through the common optical path and the LO optical path, and provide the LO optical signal to an LO input path 608 of the transceiver/TX amplifier device 602 using lens coupling. The seed device 650 may generate, based on a light beam from the laser source 652, a TX optical signal through the common optical path and the TX optical path, and provide the TX optical signal to a TX input path 606 of the transceiver/TX amplifier device 602 using lens coupling. In lens coupling, an input of transceiver/TX amplifier device 602 and an output of the seed device 650 may be coupled using a lens, e.g., ball lens.

In some implementations, the LIDAR sensor system 600 may include a plurality of TX amplifier assemblies 604-1, 604-2, 604-3, and 604-4. Each of the plurality of TX amplifier assemblies 604-1, 604-2, 604-3, and 604-4 may be implemented in a configuration similar to that shown in FIG. 3B. For example, the TX amplifier assembly 604-1 may include an array of five (5) tapered optical amplifiers (TPAs) in a first chip 624, an array of U-shaped passive waveguide components in a second chip 626, and a micro-lens array 628. Each of the plurality of TX amplifier assemblies 604-1, 604-2, 604-3, and 604-4 may be a separate unit by itself and be present off-chip from the chip implementing the transceiver/TX amplifier device 602. In some implementations, each of the plurality of TX amplifier assemblies 604-1, 604-2, 604-3, and 604-4 may receive, via a splitter 610, the TX optical signal at a respective TX input optical path 614, 616, 618, 620. In response to receiving the TX optical signal, each TX amplifier array may output amplified TX signals from 4 TPAs in the array (e.g., 4 leftmost TPAs) to one of four (4) sets of eight (8) transceivers (M=4, N=8).

In some implementations, the transceiver/TX amplifier device 602 may include a plurality of transceivers 622-1, 622-2, . . . , 622-32. Each of the plurality of transceivers may have configuration similar to that of the single-channel transceiver 400 in FIG. 4A. As described above, the plurality of TX amplifier assemblies 604-1, 604-2, 604-3, and 604-4 may output amplified TX optical signals to respective TX inputs of the plurality of transceivers via output optical paths or TX optical path arrays (e.g., TX optical array 630), a plurality of splitters (e.g., splitter 632), and a plurality of split TX optical paths (e.g., split TX optical path bundle 634). For example, as shown in FIG. 6, the plurality of transceivers may include four (4) sets of eight (8) transceivers (M=4, N=8). With this configuration, a processor of the LIDAR sensor system may alternately turn on the seed device 650 and turn on the transceiver device 602/the plurality of TX amplifier arrays M times during a period to transmit M×N TX optical signals to an environment. The processor may turn on the seed device 650 with a first duty cycle and turn on the transceiver device 602/the plurality of TX amplifier arrays with a second duty cycle during the period to transmit M×N TX optical signals to the environment. The processor may temporally multiplex M sets of N transceivers so that a (selected) set of N transceivers may transmit N TX optical signals to the environment at M different times during the period. The processor may determine a sequence of M sets of N transceivers and perform time sequencing according to the determined sequence so that each of M sets of N transceivers may transmit N TX optical signals to the environment, according to the sequence at M different times during the period.

In some implementations, the LO signal generated by the seed device 650 may be provided to respective LO inputs of the plurality of transceivers 622-1, 622-2, . . . , 622-32 via a splitter (e.g., splitter 612) and a plurality of split optical LO paths (e.g., split optical LO path bundle 636). With this configuration, the LIDAR sensor system 600 may be configured to generate and provide M×N LO signals to the plurality of transceivers. For example, the processor may (1) temporally multiplex M sets of N transceivers so that a (selected) set of N transceivers may receive N LO signals at M different times during a period, or (2) determine a sequence of M sets of N transceivers and perform time sequencing according to the sequence so that each of M sets of N transceivers may receive N LO signals, according to the sequence at M different times during the period. In some implementations, the seed device 650 may provide the same LO signal to the M sets of N transceivers substantially at the same time.

In some implementations, the transceiver device 602 may be implemented in a chip or integrated circuit including at least one of silicon photonics circuitry, programmable logic controller (PLC), III-V semiconductor circuitry, or silicon nitride ($Si_3N_4$)-based circuitry. For example, the plurality of transceivers 622-1, 622-2, . . . , 622-32 may be implemented in silicon photonics circuitry, programmable logic controller (PLC), III-V semiconductor circuitry, silicon nitride ($Si_3N_4$)-based circuitry, or combinations thereof. The LO optical paths, such as 608, 636, etc. and the TX optical paths 606, 614, 616, 618, 620, 630, 634, etc. may be implemented in silicon nitride ($Si_3N_4$)-based circuitry.

In some implementations, the seed device 650 may be implemented in a chip or integrated circuit including at least one of III-V semiconductor circuitry or micro-optics circuitry. For example, the laser source 652, the modulator 660, and the pair of TPAs 662 may be implemented in III-V semiconductor circuitry. The optical isolator 656 and lenses 654, 658, 664, 666, 668, 670 may be implemented in micro-optics circuitry.

An advantage of the example architecture of the coherent LIDAR sensor system 600 in FIG. 6 is the improved tolerance to warpage in the chip implementing the transceiver/TX amplifier device 602 as each of the plurality of TX amplifier assemblies is separate and includes hybrid integration on the input sides of the optical amplifier array and lens coupling on the output sides of the optical amplifier array. The separate TX amplifier assemblies, however, may require active alignment during assembly.

Figure 7:
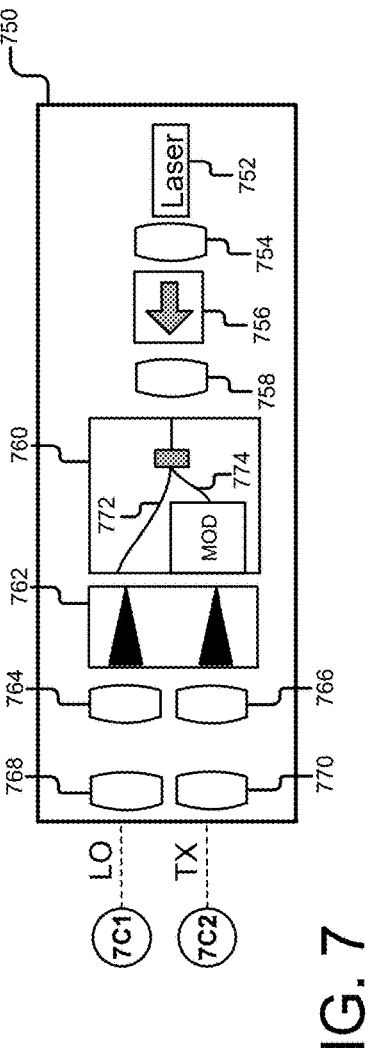
FIG. 7 is a schematic diagram illustrating another example architecture of a coherent LIDAR sensor system, according to some implementations.

FIG. 7 is a schematic diagram illustrating an example architecture of a coherent LIDAR sensor system 700, according to some implementations.

Referring to FIG. 7, a LIDAR sensor system 700 may include a seed device 750 and a transceiver/TX amplifier device 702. In some implementations, the seed device 750 may include a laser source 752, a first set of optics including a lens 754, an optical isolator 756, and a lens 758, a modulator 760 (e.g., I/Q modulator), a pair of tapered optical amplifiers (TPAs) 762, a second set of optics including lenses 764, 768, and a third set of optics including lenses 766, 770. The first set of optics including the lens 754, the optical isolator 756, and the lens 758 may form a common optical path. An upper branch 772 in the modulator 760, an upper TPA in the pair 762, and the second set of optics including the lenses 764, 768 may form an LO optical path, while a lower branch 774 in the modulator 760, a lower TPA in the pair 762, and the third set of optics including the lens 766, 770 may form a TX optical path. With this configuration, the seed device 750 may generate, based on a light beam from the laser source 752, an LO signal through the common optical path and the LO optical path, and provide the LO optical signal to an LO input path 716 of the transceiver/TX amplifier device 702 using lens coupling. The seed device 750 may generate, based on a light beam from the laser source 752, a TX optical signal through the common optical path and the TX optical path, and provide the TX optical signal to a TX input path 718 of the transceiver/TX amplifier device 702 using lens coupling. In lens coupling, an input of transceiver/TX amplifier device 702 and an output of the seed device 750 may be coupled using a lens, e.g., ball lens.

In some implementations, the transceiver/TX amplifier device 702 may include a plurality of TX amplifier arrays 724-1, 724-2, 724-3, 724-4. Each of the plurality of TX amplifier arrays 724-1, 724-2, 724-3, 724-4 may be implemented in a chip which has configuration similar to that of the chip 352 in FIG. 3C. Each TX amplifier array may include, at input sides thereof, a plurality of apertures (not shown) to which a TX optical signal generated by the seed device 750 may be provided. The TX optical signal generated by the seed device 750 may be provided to the plurality of TX amplifier arrays via a multi-stage splitter assembly including one or more splitters 704, 706-1, 706-2, 706-3, 706-4. In one example, the one or more splitters may be one or more fiber splitters. An output side of a splitter (e.g., splitter 706-1) may be coupled to an input side of an optical amplifier (e.g., TX amplifier array 724-1) using butt coupling. For example, in butt coupling, an input side of an optical amplifier in the TX amplifier array 724-1 may be facing directly towards an output (e.g., waveguide ends) of the splitter 706-1. In this manner, the seed device 750 can seed multiple TX amplifiers (e.g., tapered SOAs or a tapered SOA array) with multiple apertures with one optical signal.

In some implementations, the transceiver/TX amplifier device 702 may include a plurality of transceivers 710-1, 710-2, . . . , 710-32. Each of the plurality of transceivers may have configuration similar to that of the single-channel transceiver 400 in FIG. 4A. The plurality of TX amplifier arrays 724-1, 724-2, 724-3, 724-4 may output amplified TX optical signals to respective TX inputs of the plurality of transceivers via a plurality of output optical paths or TX optical path arrays (e.g., TX optical array 712), a plurality of splitters (e.g., splitter 712), and a plurality of split TX optical paths (e.g., split TX optical path bundle 722). For example, as shown in FIG. 7, the plurality of transceivers may include four (4) sets of eight (8) transceivers (M=4, N=8). With this configuration, a processor of the LIDAR sensor system may alternately turn on the seed device 750 and turn on the transceiver/TX amplifier device 702 M times during a period to transmit M×N TX optical signals to an environment. The processor may turn on the seed device 750 with a first duty cycle and turn on the transceiver/TX amplifier device 702 with a second duty cycle during the period to transmit M×N TX optical signals to the environment. The processor may temporally multiplex M sets of N transceivers so that a (selected) set of N transceivers may transmit N TX optical signals to the environment at M different times during the period. The processor may determine a sequence of M sets of N transceivers and perform time sequencing according to the determined sequence so that each of M sets of N transceivers may transmit N TX optical signals to the environment, according to the sequence at M different times during the period.

In some implementations, the LO signal generated by the seed device 750 may be provided to respective LO inputs of the plurality of transceivers 710-1, 710-2, . . . , 710-32 via a splitter (e.g., splitter 708) and a plurality of split optical LO paths (e.g., split optical LO path bundle 720) emerging out from the splitter 708. With this configuration, the LIDAR sensor system 700 may be configured to generate and provide M×N LO signals to the plurality of transceivers. For example, the processor may (1) temporally multiplex M sets of N transceivers so that a (selected) set of N transceivers may receive N LO signals at M different times during a period, or (2) determine a sequence of M sets of N transceivers and perform time sequencing according to the sequence so that each of M sets of N transceivers may receive N LO signals, according to the sequence at M different times during the period. In some implementations, the seed device 750 may provide the same LO signal to the M sets of N transceivers substantially at the same time.

In some implementations, the transceiver/TX amplifier device 702 may be implemented in a chip or integrated circuit including at least one of silicon photonics circuitry, programmable logic controller (PLC), III-V semiconductor circuitry, or silicon nitride ($Si_3N_4$)-based circuitry. For example, the plurality of transceivers 710-1, 710-2, . . . , 710-32 and the plurality of TX amplifier arrays 724-1, 724-2, 724-3, 724-4 may be implemented in silicon photonics circuitry, programmable logic controller (PLC), III-V semiconductor circuitry, silicon nitride ($Si_3N_4$)-based circuitry, or combinations thereof. The LO optical paths, such as 716, 720, etc. and the TX optical paths 718, 712, 722, etc. may be implemented in silicon nitride ($Si_3N_4$)-based circuitry.

In some implementations, the seed device 750 may be implemented in a chip or integrated circuit including III-V semiconductor circuitry and/or micro-optics circuitry. For example, the laser source 752, the modulator 760, and the pair of TPAs 762 may be implemented in III-V semiconductor circuitry. The optical isolator 756 and lenses 754, 758, 764, 766, 768, 770 may be implemented in micro-optics circuitry.

An advantage of the example architecture of the coherent LIDAR sensor system 700 in FIG. 7 is the wafer-level assembly of the plurality of TX amplifier arrays 724-1, 724-2, 724-3, 724-4 using hybrid integration of waveguides in III-V semiconductor circuitry and silicon photonics circuitry at the input sides of the plurality of TX amplifier arrays 724-1, 724-2, 724-3, 724-4. The chip implementing the transceiver/TX amplifier device 702 may include an opening 726 to drop the micro-lens array to couple the output sides of the plurality of TX amplifier arrays 724-1, 724-2, 724-3, 724-4. The implementation of a micro-lens array may require active alignment during assembly.

Figure 8:
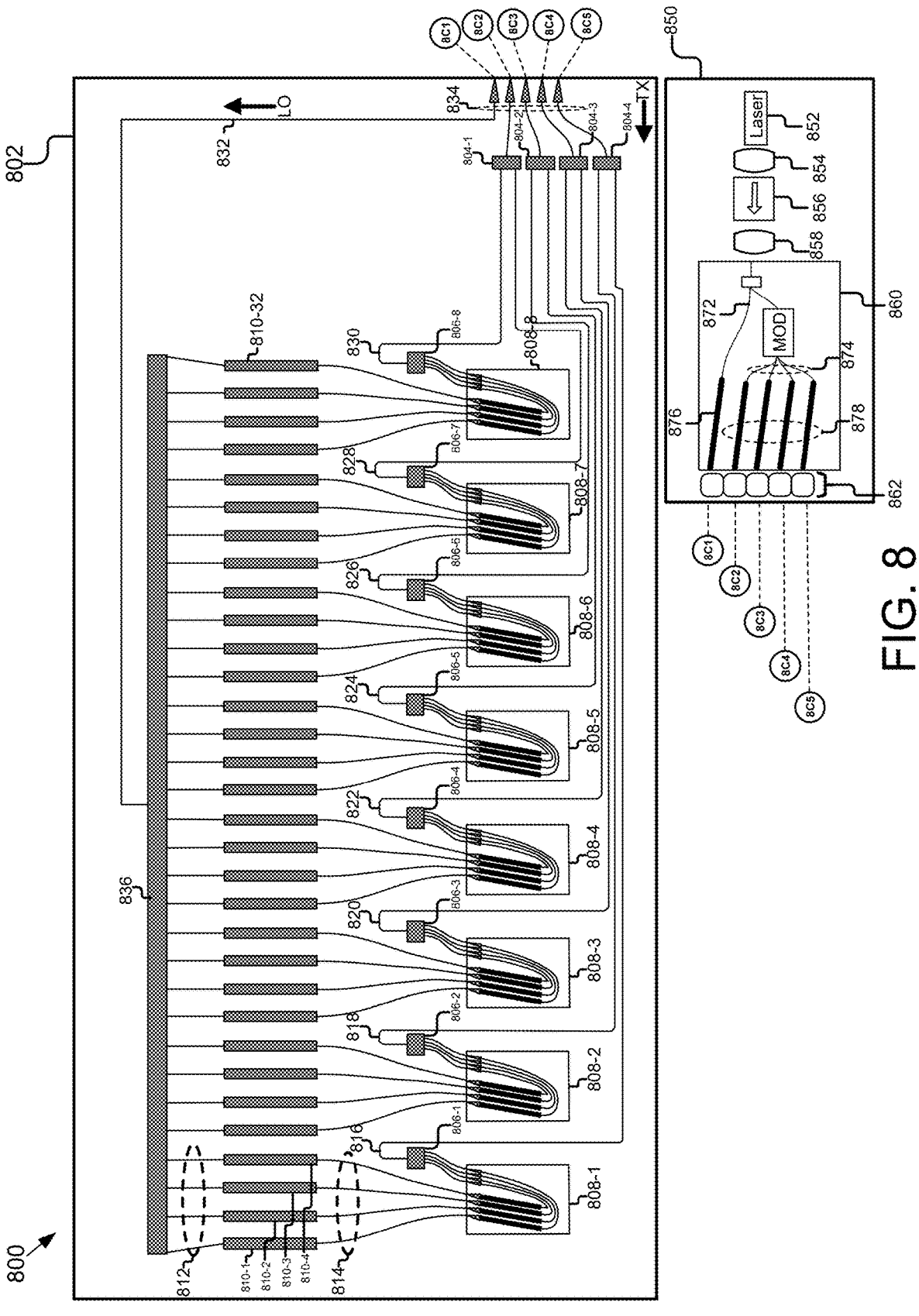
FIG. 8 is a schematic diagram illustrating another example architecture of a coherent LIDAR sensor system, according to some implementations.

FIG. 8 is a schematic diagram illustrating an example architecture of a coherent LIDAR sensor system 800, according to some implementations.

Referring to FIG. 8, a LIDAR sensor system 800 may include a seed device 850 and a transceiver/TX amplifier device 802. In some implementations, the seed device 850 may include a laser source 852, a first set of optics including a lens 854, an optical isolator 856, and a lens 858, a modulator 860 including a plurality of optical amplifiers, and a third set of optics including a micro-lens array 862. The first set of optics including the lens 854, the optical isolator 856, and the lens 858 may form a common input optical path and be configured to receive, at one end thereof, a beam from the laser source 852. The modulator 860 may include a first optical path 872 and a plurality of second optical paths 874 respectively branching out from the other end of the common input optical path. A first optical amplifier 876 may be coupled to the first optical path 872 to form a LO optical path. A plurality of second optical amplifiers 878 may be respectively coupled to the plurality of second optical paths 874 to form a plurality of TX optical paths. The seed device 850 may be configured to turn on the first optical amplifier 876 to output a modulated optical signal of the beam as an LO signal. The seed device 850 may be configured to selectively turn on one or more of the plurality of second optical amplifiers 878 to output a modulated optical signal of the beam as a TX optical signal. With this configuration, the seed device 850 may generate, based on a light beam from the laser source 852, an LO signal through the common input optical path and the LO optical path, and provide the LO optical signal to an LO input path 832 of the transceiver/TX amplifier device 802 using lens coupling. The seed device 850 may generate, based on a light beam from the laser source 852, a TX optical signal through the common input optical path and the TX optical path, and provide the TX optical signal to one or more of the plurality of TX input paths 834 of the transceiver/TX amplifier device 502 using lens coupling. In lens coupling, an input of transceiver/TX amplifier device 802 and an output of the seed device 850 may be coupled using a lens, e.g., ball lens.

In some implementations, the transceiver/TX amplifier device 802 may include a plurality of TX amplifier arrays 808-1 . . . 808-8. Each of the plurality of TX amplifier arrays 808-1 . . . 808-8 may be implemented in a chip which has configuration similar to that of the chip 376 in FIG. 3D. For example, the chip 376 is configured to integrate an optical amplifier array 384 (e.g., an array of 4 SOAs) with the array 382 of U-shaped passive waveguide components and orient the inputs and outputs of the optical amplifier array 384 on one side of the chip 376. The plurality of TX optical signals generated by the seed device 550 may be provided to the plurality of TX amplifier arrays 808-1 . . . 808-8 via a multi-stage splitter assembly including one or more splitters 804-1 . . . 804-8 and 806-1 . . . 806-8. In one example, the one or more splitters may be one or more fiber splitters. In some implementations, each of the splitters 804-1 . . . 804-8 may be a 1×2 splitter and each of the splitters 806-1 . . . 806-8 may be a 1×4 splitter. Each of the plurality of TX input paths 834 of the transceiver/TX amplifier device 502 is coupled to the input of each of the splitters 804-1 . . . 804-8. The corresponding inputs 816, 818, 820, 822, 824, 826, 828, 830 of the splitters 806-1 . . . 806-8 are coupled to the outputs of splitters 804-1 . . . 804-8. The outputs of a splitter (e.g., splitter 806-1) may be coupled to an input side of an optical amplifier array (e.g., TX amplifier array 808-1) using butt coupling. For example, in butt coupling, an input side of an optical amplifier in the TX amplifier array 808-1 is coupled to one end of the integrated U-shaped passive waveguide component and the other end of the integrated U-shaped passive waveguide component may be facing directly towards an output (e.g., waveguide ends) of the splitter 806-1. In response to receiving the TX optical signals, each TX amplifier array (e.g., an array of 4 SOAs) may output amplified TX signals to one of four (8) sets of eight (4) transceivers (M=8, N=4).

In some implementations, the transceiver/TX amplifier device 802 may include a plurality of transceivers 810-1 . . . 810-32. Each of the plurality of transceivers may have configuration similar to that of the single-channel transceiver 450 in FIG. 4B. Each of the plurality of TX amplifier arrays (e.g., TX amplifier array 808-1) may output amplified TX optical signals to respective TX inputs of the plurality of transceivers (e.g., transceivers 810-1, 810-2, 810-3, 810-4) via a plurality of output optical paths (e.g., optical TX path bundle 814). For example, as shown in FIG. 8, the plurality of transceivers may include eight (8) sets of four (4) transceivers (M=8, N=4). With this configuration, a processor of the LIDAR sensor system may alternately turn on the seed device 850 and turn on the transceiver/TX amplifier device 802 M times during a period to transmit M×N TX optical signals to an environment. The processor may turn on the seed device 850 with a first duty cycle and turn on the transceiver/TX amplifier device 802 with a second duty cycle during the period to transmit M×N TX optical signals to the environment. The processor may temporally multiplex M sets of N transceivers so that a (selected) set of N transceivers may transmit N TX optical signals to the environment at M different times during the period. The processor may determine a sequence of M sets of N transceivers and perform time sequencing according to the determined sequence so that each of M sets of N transceivers may transmit N TX optical signals to the environment, according to the sequence at M different times during the period.

In some implementations, the LO signal generated by the seed device 850 may be provided to respective LO inputs of the plurality of transceivers (e.g., transceivers 810-1, 810-2, 810-3, 810-4) via a splitter (e.g., splitter 836) and a plurality of split optical LO paths (e.g., optical LO path bundle 812). With this configuration, the LIDAR sensor system 800 may be configured to generate and provide M×N LO signals to the plurality of transceivers. For example, the processor of the LIDAR sensor system 800 may (1) temporally multiplex M sets of N transceivers so that a (selected) set of N transceivers may receive N LO signals at M different times during a period, or (2) determine a sequence of M sets of N transceivers and perform time sequencing according to the sequence so that each of M sets of N transceivers may receive N LO signals, according to the sequence at M different times during the period. In some implementations, the seed device 850 may provide the same LO signal to the M sets of N transceivers substantially at the same time.

In some implementations, the transceiver/TX amplifier device 802 may be implemented in a chip or integrated circuit including at least one of silicon photonics circuitry, programmable logic controller (PLC), III-V semiconductor circuitry, or silicon nitride ($Si_3N_4$)-based circuitry. For example, each one of the plurality of transceivers 810-1, . . . , 810-32 and the plurality of TX amplifier arrays 808-1 . . . 808-8, may be implemented in silicon photonics circuitry, programmable logic controller (PLC), III-V semiconductor circuitry, silicon nitride ($Si_3N_4$)-based circuitry, or combinations thereof. In another example, the optical TX paths (e.g., 816, 818, 820, 822, 824, 826, 828, 830, bundle

814, etc.) and the optical LO paths (e.g., 832, bundle 514, etc.) may be passive waveguides implemented in silicon photonics circuitry (e.g., silicon nitride ($Si_3N_4$)-based circuitry).

In some implementations, the seed device 850 may be implemented in a chip or integrated circuit including III-V semiconductor circuitry and/or micro-optics circuitry. For example, the laser source 852, the modulator 860, and the optical amplifiers 876, 878 may be implemented in III-V semiconductor circuitry. The optical isolator 856 and lenses 854, 858, 862 may be implemented in micro-optics circuitry.

An advantage of the example architecture of the coherent LIDAR sensor system 800 in FIG. 8 is that the throughput of wafer-level assembly of the plurality of TX amplifier arrays 808-1 . . . 808-8 in the chip implementing the transceiver/TX amplifier device 802 is doubled. The integration of the U-shaped passive components in the plurality of TX amplifier arrays 808-1 . . . 808-8 is beneficial because the optical input/output (I/O) paths for each of the plurality of TX amplifier arrays 808-1 . . . 808-8 are on a same side to efficiently couple the optical signal in and out of the plurality of TX amplifier arrays 808-1 . . . 808-8 for amplification. The configuration of optical I/O paths on the same side of each of the plurality of TX amplifier arrays 808-1 . . . 808-8 facilitates the ease of hybrid integration of corresponding waveguides on the TX amplifier arrays 808-1 . . . 808-8 in III-V semiconductor circuitry and silicon photonics circuitry of the chip implementing the transceiver/TX amplifier device 802. Another advantage of the configuration of optical I/O paths on the same side is that any possible warpage of the chip implementing the transceiver/TX amplifier device 802 is made inconsequential in the wafer-level assembly and packaging of the plurality of TX amplifier arrays 808-1 . . . 808-8 in the chip implementing the transceiver/TX amplifier device 802.

Figure 9:
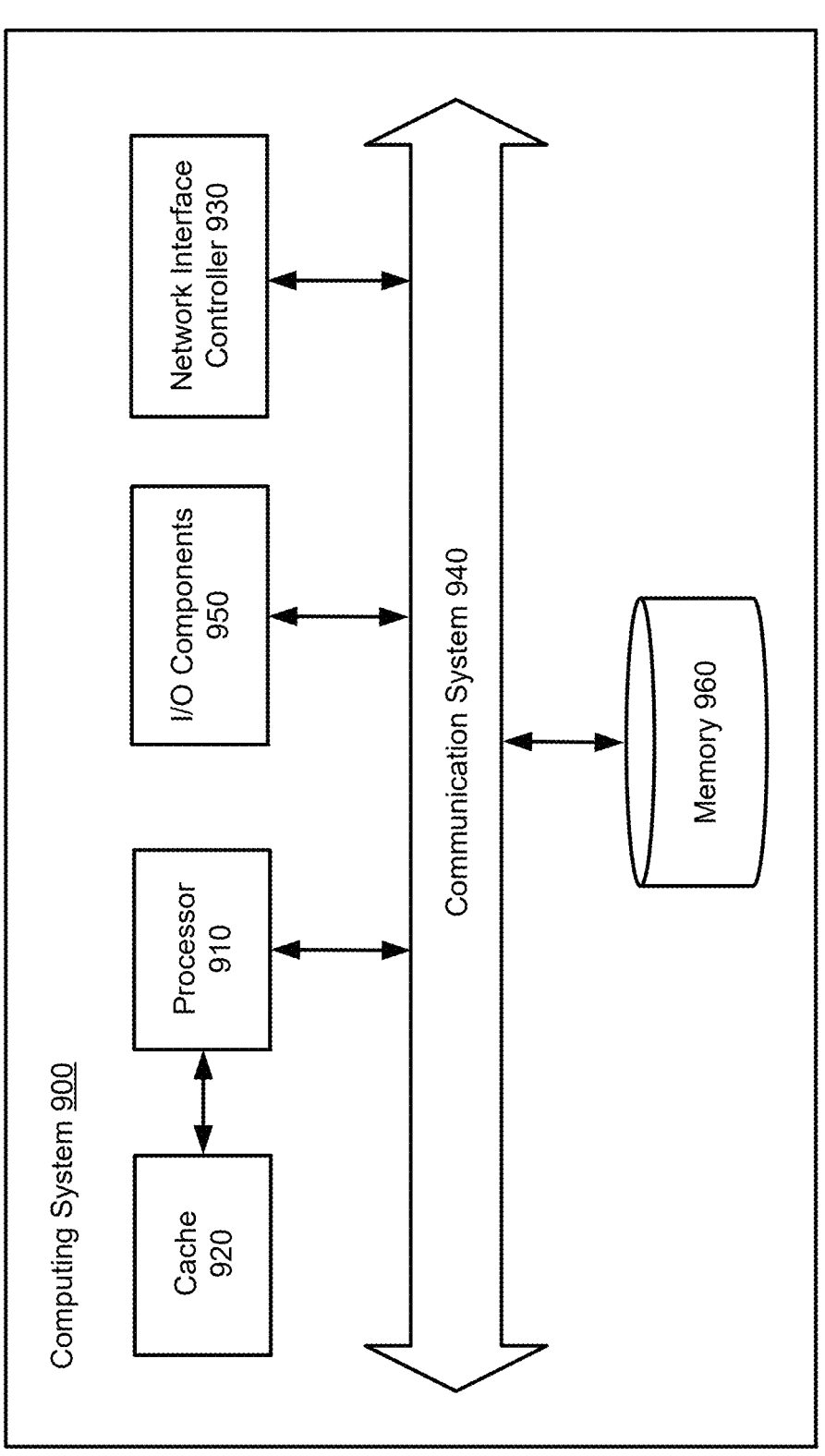
FIG. 9 is a block diagram illustrating an example of a computing system according to some implementations.

FIG. 9 is a block diagram illustrating an example of a computing system according to some implementations.

Referring to FIG. 9, the illustrated example computing system 900 includes one or more processors 910 in communication, via a communication system 940 (e.g., bus), with memory 960, at least one network interface controller 930 with network interface port for connection to a network (not shown), and other components, e.g., an input/output ("I/O") components interface 950 connecting to a display (not illustrated) and an input device (not illustrated). Generally, the processor(s) 910 will execute instructions (or computer programs) received from memory. The processor(s) 910 illustrated incorporate, or are directly connected to, cache memory 920. In some instances, instructions are read from memory 960 into the cache memory 920 and executed by the processor(s) 910 from the cache memory 920.

In more detail, the processor(s) 910 may be any logic circuitry that processes instructions, e.g., instructions fetched from the memory 960 or cache 920. In some implementations, the processor(s) 910 are microprocessor units or special purpose processors. The computing device 900 may be based on any processor, or set of processors, capable of operating as described herein. The processor(s) 910 may be single core or multi-core processor(s). The processor(s) 910 may be multiple distinct processors.

The memory 960 may be any device suitable for storing computer readable data. The memory 960 may be a device with fixed storage or a device for reading removable storage media. Examples include all forms of non-volatile memory, media and memory devices, semiconductor memory devices (e.g., EPROM, EEPROM, SDRAM, and flash memory devices), magnetic disks, magneto optical disks, and optical discs (e.g., CD ROM, DVD-ROM, or Blu-Ray® discs). A computing system 900 may have any number of memory devices as the memory 960.

The cache memory 920 is generally a form of computer memory placed in close proximity to the processor(s) 910 for fast read times. In some implementations, the cache memory 920 is part of, or on the same chip as, the processor(s) 910. In some implementations, there are multiple levels of cache 920, e.g., L2 and L3 cache layers.

The network interface controller 930 manages data exchanges via the network interface (sometimes referred to as network interface ports). The network interface controller 930 handles the physical and data link layers of the OSI model for network communication. In some implementations, some of the network interface controller's tasks are handled by one or more of the processor(s) 910. In some implementations, the network interface controller 930 is part of a processor 910. In some implementations, a computing system 900 has multiple network interfaces controlled by a single controller 930. In some implementations, a computing system 900 has multiple network interface controllers 930. In some implementations, each network interface is a connection point for a physical network link (e.g., a cat-5 Ethernet link). In some implementations, the network interface controller 930 supports wireless network connections and an interface port is a wireless (e.g., radio) receiver/transmitter (e.g., for any of the IEEE 802.11 protocols, near field communication "NFC", Bluetooth, ANT, or any other wireless protocol). In some implementations, the network interface controller 930 implements one or more network protocols such as Ethernet. Generally, a computing device 900 exchanges data with other computing devices via physical or wireless links through a network interface. The network interface may link directly to another device or to another device via an intermediary device, e.g., a network device such as a hub, a bridge, a switch, or a router, connecting the computing device 900 to a data network such as the Internet.

The computing system 900 may include, or provide interfaces for, one or more input or output ("I/O") devices. Input devices include, without limitation, keyboards, microphones, touch screens, foot pedals, sensors, MIDI devices, and pointing devices such as a mouse or trackball. Output devices include, without limitation, video displays, speakers, refreshable Braille terminal, lights, MIDI devices, and 2-D or 3-D printers.

Other components may include an I/O interface, external serial device ports, and any additional co-processors. For example, a computing system 900 may include an interface (e.g., a universal serial bus (USB) interface) for connecting input devices, output devices, or additional memory devices (e.g., portable flash drive or external media drive). In some implementations, a computing device 900 includes an additional device such as a co-processor, e.g., a math co-processor can assist the processor 910 with high precision or complex calculations.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of blocks in the processes disclosed is an example of illustrative approaches. Based upon design preferences, it is understood that the specific order or hierarchy of blocks in the processes may be rearranged while remaining within the scope of the previous description. The accompanying method claims present elements of the various blocks in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the blocks of various examples must be performed in the order presented. As will be appreciated by one of skill in the art the order of blocks in the foregoing examples may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the examples disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The blocks of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The schematic as described above is part of the design for an integrated circuit chip. The chip design is created in a graphical computer programming language and stored in a computer readable storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the computer readable storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Furthermore, relative terms, such as "lower" or "bottom" or "back" or "below" and "upper" or "top" or "front" or "above" may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The example term "lower" can, therefore, encompass both an orientation of "lower" and "upper," depending upon the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The foregoing detailed description of the present disclosure has been presented for purposes of illustration and description. It is not intended to be exhaustive or to limit the present disclosure to the precise form disclosed. Many modifications and variations are possible in light of the above teachings. The described implementations were chosen in order to best explain the principles of the present disclosure and its practical application, to thereby enable others skilled in the art to best utilize the present disclosure in various implementations and with various modifications as are suited to the particular use contemplated. It is intended that the scope of the present disclosure be defined by the claims appended hereto.

Although some implementations of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present disclosure is not intended to be limited to the particular implementations of the process, machine, fabrication, composition of matter, means, methods, and steps described in the specification. As one of ordinary skill in the art will readily appreciate from the description of the present disclosure, processes, machines, fabrication, compositions of matter, means, methods, or steps, presently existing or later to be developed, that perform substantially the same function or achieve substantially the same result as the corresponding implementations described herein may be utilized according to the present disclosure. Accordingly, the appended claims are intended to include within their scope such processes, machines, fabrication, compositions of matter, means, methods, or steps.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A device for a light detection and ranging (LIDAR) system for a vehicle, the LIDAR system comprising:
   a lens array coupled to receive a transmit signal and output a plurality of amplified transmit signals;
   a first semiconductor circuit configured to amplify the transmit signal, the first semiconductor circuit including a plurality of optical amplifiers, an output of one of the plurality of optical amplifiers coupled to receive the transmit signal from the lens array and outputs of a remainder of the plurality of optical amplifiers coupled to provide the plurality of amplified transmit signals to the lens array; and
   a second semiconductor circuit configured to split the transmit signal and generate a plurality of transmit signals, the second semiconductor circuit coupled to receive the transmit signal from an input of one of the plurality of optical amplifiers of the first semiconductor circuit corresponding to the output, and the second semiconductor circuit coupled to output the plurality of transmit signals to inputs of a remainder of the plurality of optical amplifiers of the first semiconductor circuit.

2. The device of claim 1 wherein optical input/output paths of the device are on one side of the device for efficient coupling of optical signals in and out of the device.

3. The device of claim 1 wherein the first semiconductor circuit and the second semiconductor circuit are directly aligned and butt-coupled for signal transfer.

4. The device of claim 1, wherein the first semiconductor circuit includes a tapered optical amplifier.

5. The device of claim 1, wherein the first semiconductor circuit includes an array of tapered semiconductor optical amplifiers implemented in one from a group of silicon photonics circuitry, programmable logic controller (PLC), or III-V semiconductor circuitry.

6. The device of claim 1, wherein the second semiconductor circuit includes a splitter and a plurality of U-shaped components implemented in one from a group of silicon photonics circuitry, programmable logic controller (PLC), or III-V semiconductor circuitry.

7. The device of claim 1, wherein the second semiconductor circuit includes a splitter, the splitter having an input and a plurality of outputs, the input of the splitter coupled to receive the transmit signal from the first semiconductor circuit, and the outputs of the splitter coupled to inputs of the first semiconductor circuit.

8. The device of claim 7, wherein the second semiconductor circuit includes a plurality of U-shaped components, the input of each of the plurality of U-shaped components coupled to a respective one of the plurality of outputs of the splitter, an output of each of the plurality of U-shaped components coupled to the first semiconductor circuit.

9. The device of claim 8, wherein the plurality of U-shaped components is implemented in silicon nitride ($Si_3N_4$)-based circuitry.

10. The device of claim 1, wherein the second semiconductor circuit includes a passive waveguide implemented in III-V semiconductor circuitry.

11. The device of claim 1, wherein the first semiconductor circuit has a first plurality of apertures on one side, the second semiconductor circuit has a second plurality of apertures on one side, and the first plurality of apertures of the first semiconductor circuit correspond to the second plurality of apertures of the second semiconductor circuit for hybrid integration.

12. A device for a light detection and ranging (LIDAR) system for a vehicle, the LIDAR system comprising:

a semiconductor circuit configured to amplify a plurality of optical signals, the semiconductor circuit including a plurality of optical amplifiers, a respective one of the plurality of optical amplifiers coupled to receive a respective one of the plurality of optical signals through a corresponding input and provide a respective one of a plurality of amplified optical signals through a corresponding output, the semiconductor circuit having an input side for hybrid integration; and a lens array coupled to receive the plurality of amplified optical signals, a respective one of a plurality of inputs of the lens array coupled to the corresponding output of the respective one of the plurality of optical amplifiers of the semiconductor circuit to receive the respective one of the plurality of amplified optical signals, the lens array configured to provide a bundle of optical output paths.

13. The device of claim 12, wherein the semiconductor circuit includes a tapered optical amplifier.

14. The device of claim 12, wherein the semiconductor circuit includes an array of tapered semiconductor optical amplifiers implemented in one from a group of silicon photonics circuitry, programmable logic controller (PLC), or III-V semiconductor circuitry.

15. The device of claim 12, wherein the input side of the semiconductor circuit has a plurality of apertures to which a bundle of optical input paths may be coupled by hybrid integration.

16. The device of claim 12, wherein the semiconductor circuit includes a passive waveguide implemented in III-V semiconductor circuitry.

17. The device of claim 12 wherein an optical input path and an optical output path of the semiconductor circuit are on opposite sides of the semiconductor circuit for efficient coupling of optical signals in and out of the semiconductor circuit.

18. The device of claim 12 wherein the lens array is implemented in micro-optics circuitry.

19. The device of claim 12 wherein the device is deposited on a main integrated circuit hosting a plurality of transceivers.

20. A light detection and ranging (LIDAR) system for an autonomous vehicle control system having a transmitter amplifier assembly comprising:

a lens array coupled to receive a transmit signal and output a plurality of amplified transmit signals;

a first semiconductor circuit for amplifying the transmit signal, the first semiconductor circuit including a plurality of optical amplifiers, an output of one of the plurality of optical amplifiers coupled to receive the transmit signal from the lens array and outputs of a remainder of the plurality of optical amplifiers coupled to provide the plurality of amplified transmit signals to the lens array; and a second semiconductor circuit for splitting the transmit signal and generating a plurality of transmit signals, the second semiconductor circuit coupled to receive the transmit signal from an input of one of the plurality of optical amplifiers of the first semiconductor circuit corresponding to the output, and the second semiconductor circuit coupled to output the plurality of transmit signals to inputs of a remainder of the plurality of optical amplifiers of the first semiconductor circuit.

* * * * *